US012613363B2

(12) United States Patent

Nagasawa

(10) Patent No.: US 12,613,363 B2
(45) Date of Patent: Apr. 28, 2026

(54) MEASUREMENT DEVICE, WEARABLE DEVICE, AND METHOD OF MANUFACTURING MEASUREMENT DEVICE

(71) Applicant: Kazuki Nagasawa, Miyagi (JP)

(72) Inventor: Kazuki Nagasawa, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 90 days.

(21) Appl. No.: 18/596,692

(22) Filed: Mar. 6, 2024

(65) Prior Publication Data

US 2024/0319414 A1     Sep. 26, 2024

(30) Foreign Application Priority Data

Mar. 22, 2023     (JP) ................................. 2023-045807

(51) Int. Cl.
| | |
|---|---|
| *G02B 5/00* | (2006.01) |
| *G01N 21/552* | (2014.01) |
| *H01L 25/16* | (2023.01) |

(52) U.S. Cl.
CPC ........... *G02B 5/008* (2013.01); *G01N 21/553* (2013.01); *H01L 25/167* (2013.01)

(58) Field of Classification Search
CPC ........ G02B 5/008; G02B 6/42; G01N 21/553; H01L 25/167
See application file for complete search history.

(56) References Cited

U.S. PATENT DOCUMENTS

| | | | | |
|---|---|---|---|---|
| 5,402,435 A * | 3/1995 | Shiono | ................... | G02B 6/124 |
| | | | | 372/50.1 |
| 7,221,456 B2 * | 5/2007 | Kanai | .................. | G01N 21/553 |
| | | | | 356/445 |
| 7,652,767 B2 * | 1/2010 | Harsh | ....................... | G01J 3/02 |
| | | | | 356/445 |
| 2001/0040679 A1 * | 11/2001 | Kawabata | ........... | G01N 21/553 |
| | | | | 356/445 |
| 2005/0117158 A1 * | 6/2005 | Kanai | .................. | G01N 21/553 |
| | | | | 356/445 |
| 2007/0222998 A1 * | 9/2007 | Sasaki | .................. | G01N 21/553 |
| | | | | 356/445 |
| 2010/0067015 A1 * | 3/2010 | Matsushita | ........... | G01J 3/0256 |
| | | | | 264/299 |

(Continued)

FOREIGN PATENT DOCUMENTS

| | | |
|---|---|---|
| JP | H11-344437 A | 12/1999 |
| JP | 2020-161800 A | 10/2020 |
| JP | 2021-067652 A | 4/2021 |

OTHER PUBLICATIONS

Kirill V. Larin, et al., "Noninvasive Blood Glucose Monitoring With Optical Coherence Tomography", Diabetes Care, vol. 25, No. 12, Dec. 2002, p. 2263-p. 2267.

*Primary Examiner* — Abdullahi Nur
(74) *Attorney, Agent, or Firm* — XSENSUS LLP

(57)     ABSTRACT

A measurement device includes a semiconductor substrate, a light-emitting element that emits light into the semiconductor substrate, a measurement portion on which the light that has passed through the semiconductor substrate is incident as incident light and that reflects at least a part of the incident light as reflected light, and a light-receiving element that receives the reflected light that has passed through the semiconductor substrate.

20 Claims, 18 Drawing Sheets

(56)                    References Cited

U.S. PATENT DOCUMENTS

| 2017/0250169 A1* | 8/2017 | Mehrl | ................... G01S 7/4811 |
| 2020/0303901 A1 | 9/2020 | Nagasawa et al. | |
| 2022/0369963 A1 | 11/2022 | Oba et al. | |

\* cited by examiner

MEASUREMENT DEVICE, WEARABLE DEVICE, AND METHOD OF MANUFACTURING MEASUREMENT DEVICE

CROSS-REFERENCE TO RELATED APPLICATION

This patent application is based on and claims priority pursuant to 35 U.S.C. § 119(a) to Japanese Patent Application No. 2023-045807, filed on Mar. 22, 2023, in the Japan Patent Office, the entire disclosure of which is hereby incorporated by reference herein.

BACKGROUND

Technical Field

The present disclosure relates to a measurement device, a wearable device, and a method of manufacturing a measurement device.

Related Art

The known surface plasmon resonance sensor apparatus includes a surface emitting laser employed as a light source, and a sensory array such as a CCD array, which are arranged on a common substrate, and a light-transmitting medium and a metal thin film provided above the substrate.

SUMMARY

According to an embodiment of the present disclosure, a measurement device includes a semiconductor substrate; a light-emitting element that is disposed on the semiconductor substrate and that emits light into the semiconductor substrate; a measurement portion on which the light that has passed through the semiconductor substrate is incident as incident light and that reflects at least a part of the incident light as reflected light; and a light-receiving element that receives the reflected light that has passed through the semiconductor substrate.

According to an embodiment of the present disclosure, a wearable device includes the measurement device and an area that is to be in contact with a measurement target.

According to an embodiment of the present disclosure, a measurement device includes a semiconductor substrate; a light-emitting element that emits light into the semiconductor substrate; a measurement portion on which the light that has passed through the semiconductor substrate is incident as incident light and that reflects at least a part of the incident light as reflected light; and a light-receiving element that is disposed on the semiconductor substrate and that receives the reflected light that has passed through the semiconductor substrate.

According to an embodiment of the present disclosure, a wearable device includes the measurement device and an area that is to be in contact with a measurement target.

According to an embodiment of the present disclosure, a method of manufacturing a measurement device includes forming a light-emitting element such that light is emitted by the light-emitting element into a semiconductor substrate of the measurement device; and disposing a measurement portion on the semiconductor substrate such that the light that has passed through the semiconductor substrate is incident on the measurement portion.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein:

FIG. 9A is a plan view illustrating a front surface of a measurement device according to a fourth embodiment;

FIG. 9B is a plan view illustrating a back surface of the measurement device according to the fourth embodiment;

FIG. 10 is a schematic view (cross-sectional view) of the measurement device according to the fourth embodiment;

FIG. 13A is a graph illustrating a waveform of surface plasmon resonance according to a comparative example;

FIG. 13B is a graph illustrating a waveform of surface plasmon resonance according to the fourth embodiment;

FIG. 14A is a plan view illustrating a front surface of a measurement device according to a fifth embodiment;

FIG. 14B is a plan view illustrating a back surface of the measurement device according to the fifth embodiment;

FIG. 15 is a schematic view (cross-sectional view) of the measurement device according to the fifth embodiment;

FIG. 16 is a schematic view (cross-sectional view) of a measurement device according to a sixth embodiment;

FIG. 18 is a schematic view (cross-sectional view) of a measurement device according to an eighth embodiment;

Figure 1:
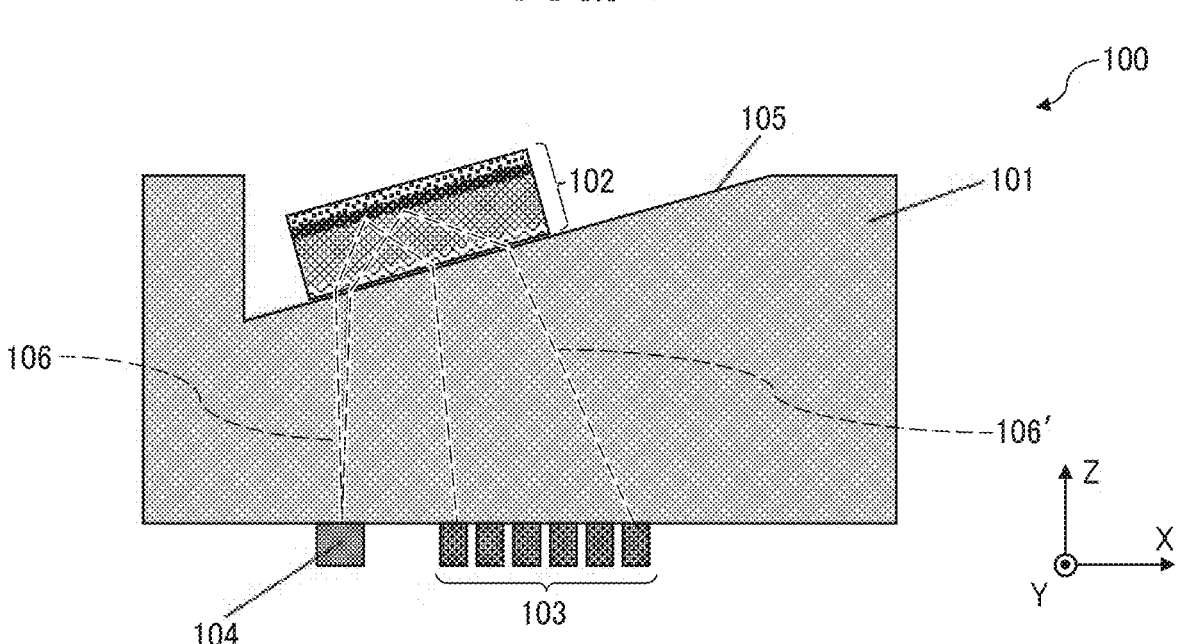
FIG. 1 is a schematic view of a measurement device according to a first embodiment.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

First Embodiment

FIG. 1 is a schematic view of a measurement device 100 according to a first embodiment. The measurement device 100 according to the present embodiment is a measurement device that uses a surface plasmon resonance phenomenon and that is also called a surface plasmon resonance sensor. The measurement device 100 includes a light source 104, a sensitive portion 102, a photodiode array 103, and a semiconductor substrate 101. Light 106 generated by the light source 104 propagates through the semiconductor substrate 101, is reflected by an inclined mirror structure 105, and is incident on the sensitive portion 102 as incident light 106. At least a part of the incident light 106 is reflected by the sensitive portion 102, and reflected light 106' is received by the photodiode array 103. These components will be described individually.

Light Source

The light source 104 may be a back-emission light-emitting diode structure, a back-emission surface emitting laser, or the like. Such a light source is formed on the semiconductor substrate 101 by metal organic chemical vapor deposition (MOCVD), molecular beam epitaxy (MBE), or the like.

As illustrated in FIG. 1, the semiconductor substrate 101 is on an XY plane. Hereinafter, the surface viewed in a +Z direction will be referred to as a front surface, and the surface viewed in a −Z direction will be referred to as a back surface. When the light source 104 is a back-emission surface emitting laser disposed on the back surface (−Z surface) of the semiconductor substrate 101, the light source 104 emits light in the +Z direction (toward the semiconductor substrate 101).

When the light source 104 is a light-emitting diode, the light source 104 has a layer structure including a lower contact layer, a light-emitting region including a carrier active layer, and an upper contact layer disposed on the semiconductor substrate 101. A multilayer film structure (for example, a Bragg reflector structure, which will be described below) for increasing the reflectance may be disposed between the light-emitting region and the upper contact layer as appropriate so that light is easily emitted toward the back surface. When the light source 104 is a surface emitting laser, the light source 104 has a layer structure including a lower Bragg reflector, a resonance region including an active layer, and an upper Bragg reflector grown on the semiconductor substrate 101.

The Bragg reflector is a structure in which materials having different refractive indices are alternately laminated with an optical film thickness of ¼ wavelength with respect to an emission wavelength λ.

Light resonates between the upper Bragg reflector and the lower Bragg reflector in a direction perpendicular to the substrate, and part of the light is emitted in a direction perpendicular to the substrate. The back-emission surface emitting laser structure including an upper mirror having a high reflectance emits laser light toward the substrate.

The growth structure of the multilayer film is subjected to formation of a mesa, formation of a current constriction region using selective oxidation or the like, formation of a passivation layer and an electrode, and the like using various semiconductor process techniques, and thereby a surface emitting laser or a light-emitting diode is obtained.

The light source 104 may be a plurality of light sources arranged in an array. The light source 104 selectively uses a wavelength that is not absorbed by the semiconductor substrate 101.

Photodiode Array

The photodiodes of the photodiode array 103 have the same growth structure as that of the light source 104. In response to the light-emitting diode or the surface emitting laser is irradiated with light, light absorption occurs in the active layer, and carriers are excited. A voltage is applied to the active layer through an electrode, excited carriers are extracted, and the amount of current is converted into a light intensity.

The photodiode array 103 can be formed simultaneously with the light source 104 because the photodiode array 103 can be formed by performing a semiconductor process similar to that for forming the light source 104 by changing patterning. The photodiode array 103 may be arranged one-dimensionally or two-dimensionally.

Surface Plasmon Resonance

At a planar interface where two regions having different dielectric constants are in contact with each other, an electromagnetic wave traveling along the interface may be present. In the case of an interface between a metal and a dielectric, free electrons of the metal form a compressional wave, which propagates along the interface and is called a surface plasmon wave. In the dielectric near the surface of the metal, an electric field is formed ranging from a region where electrons are sparse to a region where electrons are dense due to a compressional wave of electrons of surface plasmon.

The electric field is formed in a direction perpendicular to the interface. Thus, p-polarized light having an electric field in the perpendicular direction is used to excite surface plasmon by interaction with the electric field.

The wave number of surface plasmon is larger than the wave number of normal light. Thus, a wave number conservation law does not hold, and it is impossible to excite surface plasmon. An evanescent wave generated when p-polarized light incident at the critical angle or more is totally reflected has an incident angle at which the wave number coincides with that of a surface plasmon wave. This incident angle is generally called a surface plasmon resonance angle, at which a surface plasmon wave is strongly excited. This phenomenon is referred to as surface plasmon resonance.

In the vicinity of the resonance angle, the energy of incident light is used to excite a surface plasmon wave via an evanescent wave, and thus the intensity of reflected light decreases.

The resonance angle is greatly affected by a minute change in the refractive index in a region of about 100 nm from the surface of the metal in the perpendicular direction. For example, when antibodies are immobilized on the surface of the metal and a fluid containing antigens is allowed to flow thereto, the antibodies capture the antigens. As a result, the refractive index of the surface slightly changes and the resonance angle varies. Sensing of a change in the resonance angle using such a reaction makes it is possible to detect organic molecules and estimate the concentration of organic molecules. The above-described measurement device 100 is referred to as a surface plasmon resonance sensor.

The light source 104 may be either a light-emitting diode or a surface emitting laser, but p-polarized incident light is used for excitation of surface plasmon resonance. A surface emitting laser can emit p-polarized light. A light-emitting diode emits non-polarized light. Thus, the waveform of surface plasmon resonance is measured simultaneously with reflected light of an s-polarized light component, and the accuracy of the measurement device 100 decreases.

A surface emitting laser is excellent in monochromaticity as compared with a light-emitting diode. Thus, a sharp waveform can be obtained by wavelength dispersion of surface plasmon resonance. Thus, the measurement accuracy of surface plasmon resonance is higher when a surface emitting laser is employed.

On the other hand, a light-emitting diode can be manufactured at low cost. Thus, a surface emitting laser or a light-emitting diode may be selected as appropriate.

Inclined Mirror Structure

Light emitted by the light source 104 is reflected by the inclined mirror structure 105 disposed on the front surface of the semiconductor substrate 101 and travels straight through the semiconductor substrate 101 while being reflected.

The inclined mirror structure 105 is formed by gray scale exposure and etching, etching using a difference in etching rate among crystal orientations, or the like. The sensitive portion 102 is disposed on the mirror surface of the inclined mirror structure 105. The inclined mirror structure 105 may have a curved surface. In particular, a curved mirror having a curvature that causes light to be reflected in a divergent manner is preferable.

Sensitive Portion

The sensitive portion 102 includes an antireflection coating and a dielectric layer that are formed using typical photolithography and plasma chemical vapor deposition or the like, and a metal layer that is formed using photolithography and a technique such as vacuum deposition or sputtering. The metal layer has disposed thereon a sensitive film for capturing a substance to be measured such as antibodies. The sensitive film is formed by an immobilization process of organic molecules such as a self-assembled monolayer and antibodies. A patterning technique such as photolithography may be used in combination. The sensitive film may be formed on the entire surface of a wafer without using a patterning technique. The sensitive portion 102 includes at least the metal layer and the sensitive film, and may or may not include the antireflection coating and the dielectric layer. The inclined mirror structure 105 and the sensitive film are formed on the front surface of the semiconductor substrate 101 by a method of a semiconductor process.

Figure 2:
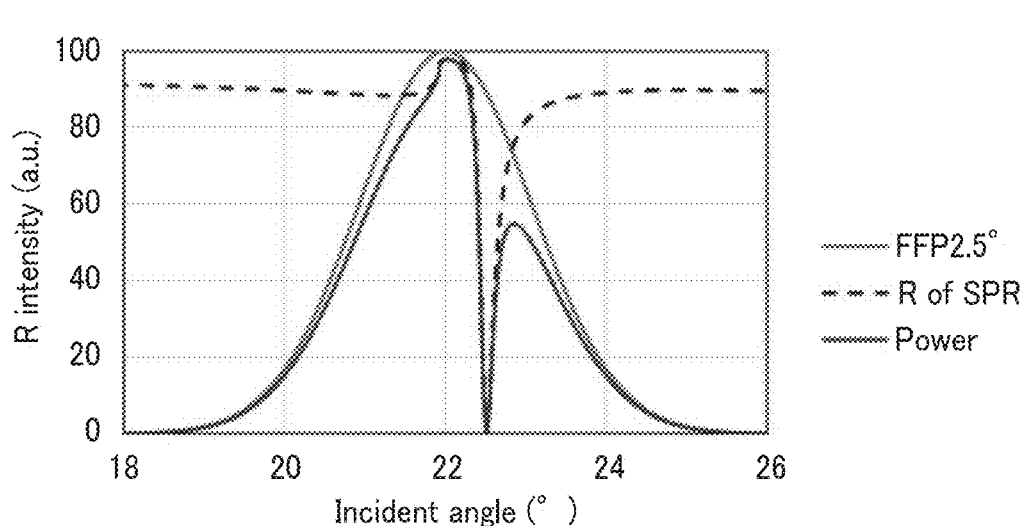
FIG. 2 illustrates a surface plasmon resonance waveform of a surface emitting laser having a divergence angle of 2.5 degrees.

Light from the light source 104 has a divergence angle and propagates through the semiconductor substrate 101 (optical path) while spreading. The light is incident on the sensitive portion 102 disposed on the inclined mirror structure 105 and is reflected by the metal layer. The divergence angle of the light corresponds to an incident angle on the metal layer in the sensitive portion 102. The reflected light has an intensity distribution that is the product of the reflectance with respect to the incident angle of surface plasmon resonance and the intensity distribution of the light having a divergence angle. FIG. 2 illustrates an example of the intensity distribution of reflected light when a back-emission surface emitting laser having a divergence angle of 2.5 degrees is used. FIG. 2 illustrates a surface plasmon resonance waveform of a surface emitting laser having a divergence angle of 2.5 degrees.

The reflected light further travels straight through the semiconductor substrate 101 and is received by the photodiode array 103. An angular component of the reflected light is converted into coordinates of the photodiode array 103 and detected. Upon organic molecules being captured by the sensitive film in the sensitive portion 102, the resonance angle is shifted, which is detected as a coordinate change of a signal in the photodiode array 103.

Actually, the waveform in FIG. 2 is measured by the pitch of the arrangement of the photodiodes, and thus it is impossible to continuously measure the waveform. In particular, the number of measurement points is small in the vicinity of the resonance angle, and thus the arrangement pitch of the photodiode array 103 is to be narrowed as much as possible. A two-dimensional array structure may be employed as appropriate to increase the spatial resolution. In addition, to reduce an error such as measurement noise of the photodiodes, measurement is performed a plurality of times under the same condition, and an averaging process or the like is performed. Thereafter, the waveform is estimated to obtain a measurement result of a change in the resonance angle.

In this method, the individual elements of the measurement device 100 can be formed by integration of a semiconductor process, and it is possible to fabricate a surface plasmon resonance sensor smaller than that fabricated by using an existing method of mounting elements individually and a process performed after chip division.

Detailed Description of Measurement Device

Figures 3A, 3B:
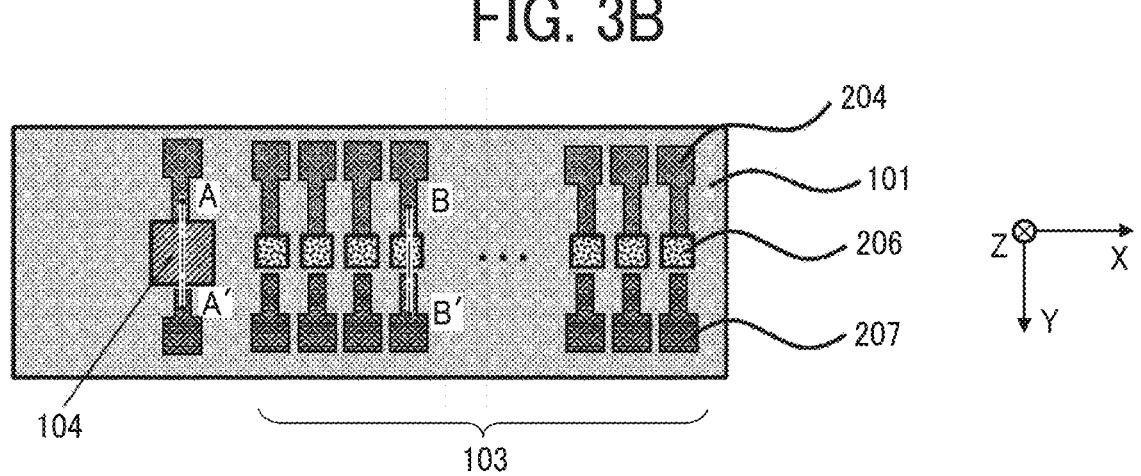
FIG. 3A is a plan view illustrating a front surface of the measurement device according to the first embodiment.
FIG. 3B is a plan view illustrating a back surface of the measurement device according to the first embodiment.

FIG. 3A is a plan view illustrating a front surface of the measurement device 100 according to the present embodiment. FIG. 3B is a plan view illustrating a back surface of the measurement device 100 according to the present embodiment. FIGS. 3A and 3B are simplified for the description of the present embodiment. The scale, the number of constituent elements, and so forth illustrated in the figures are different from those of the actual configuration for convenience.

Figures 4, 5:
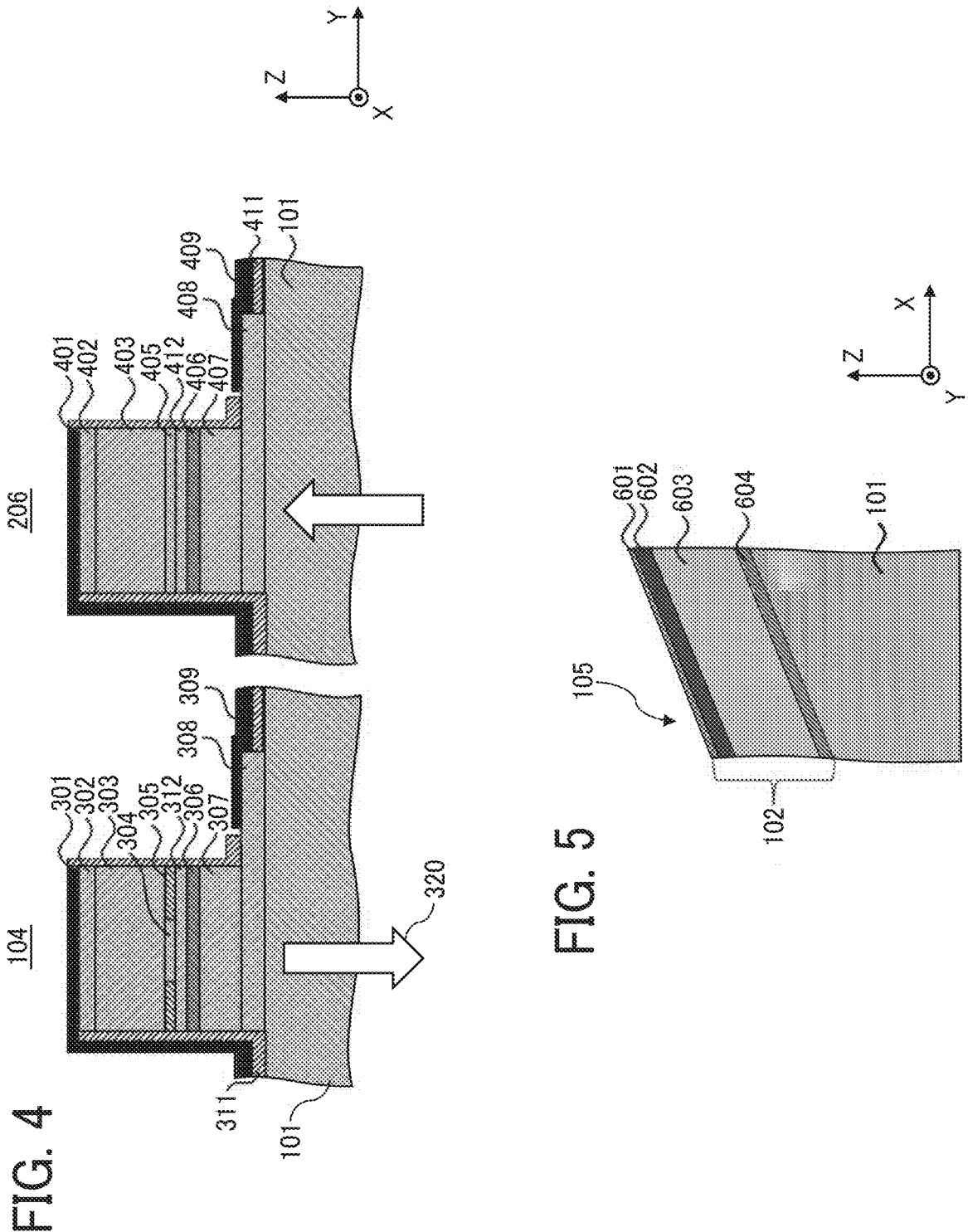
FIG. 4 is a partial cross-sectional view of a light source and a photodiode of the measurement device according to the first embodiment.
FIG. 5 is a cross-sectional view of a sensitive portion of the measurement device according to the first embodiment.

FIG. 4 is a partial cross-sectional view illustrating the light source 104, which is a surface emitting laser, and one of photodiodes 206 of the photodiode array 103 according to the present embodiment, and illustrates cross sections taken along the line A-A' in FIG. 3B and the line B-B' in FIG. 3B. FIG. 4 is simplified for the description of the present embodiment, and a detailed description of a layer structure and so forth is omitted for convenience.

FIG. 5 is a partial cross-sectional view illustrating the inclined mirror structure 105 and the sensitive portion 102 disposed thereon according to the present embodiment, and illustrates a cross section taken along the line D-D' in FIG. 3A. FIG. 5 is simplified for the description of the present embodiment, and a detailed description of a layer structure and so forth is omitted for convenience.

The sensitive portion 102 illustrated in FIG. 3A is disposed on the semiconductor substrate 101, which is a GaAs substrate. On a crystal growth surface of the semiconductor substrate 101, one or more light sources 104 are disposed, and the photodiodes 206 are disposed in an array to form the photodiode array 103. In a case where a plurality of light sources 104 are disposed, the light sources 104 may be disposed one-dimensionally or two-dimensionally. The photodiode array 103 may be disposed two-dimensionally. A positive-side electrode 204 and a negative-side electrode 207 are individually connected to each element.

On the front surface of the semiconductor substrate 101 (the surface opposite to the crystal growth surface, i.e., the surface viewed in the +Z direction), the inclined mirror structure 105 and the sensitive portion 102 are disposed. The sensitive portion 102 has a chip size of about 1 mm or less in the longitudinal direction and about 100 $\mu$m in the short-side direction. The individual elements may be arranged more densely with a minimum processing width in the process of forming the elements to achieve further miniaturization.

Hereinafter, a description will be given of a case where the light source 104 is a back-emission surface emitting laser. FIG. 4 is a simplified cross-sectional view of the structures of the light source 104 taken along the chain line A-A' in FIG. 3B and the photodiode 206 in the photodiode array 103 taken along the chain line B-B' in FIG. 3B.

As illustrated in FIG. 4, the light source 104 has a mesa structure. The mesa structure of the light source 104 may have, when viewed from the top, a circular shape, an ellipse shape, a square shape, a rectangular shape, or the like. The light source 104 emits laser light toward the front surface (opposite to the crystal growth surface) of the semiconductor substrate 101 (in a direction 320 indicated by an arrow in FIG. 4). The laser light propagates through the semiconductor substrate 101. The light source 104 may include a plurality of light sources, and each of the light sources may be connected to a corresponding one of electrodes.

The light source 104 includes an n-type contact layer 308 disposed on the semiconductor substrate 101. The n-type contact layer 308 is made of, for example, n-GaAs. The n-type contact layer 308 is connected to an n-electrode 309. On the n-type contact layer 308, a lower Bragg reflector 307 (hereinafter referred to as a lower DBR 307) is disposed. DBR is an abbreviation of distributed Bragg reflector.

The semiconductor substrate 101 may be, for example, a SI-GaAs substrate (semi-insulating type). The lower DBR 307 is formed by alternately laminating semiconductor materials having different refractive indices. Specifically, the lower DBR 307 can be formed, for example, by laminating 23.5 pairs of an n-$Al_{0.16}Ga_{0.84}$ As high-refractive-index layer and an n-$Al_{0.9}Ga_{0.1}$ As low-refractive-index layer such that each layer has an optical film thickness of $\frac{1}{4}$ wavelength. The number of pairs in the lower DBR 307 may be more or less than 23.5 in order to achieve a desired reflectance, and the composition ratio of AlGaAs in the material system may be changed.

On the lower DBR 307, a carrier excitation layer 306 serving as a resonator region is disposed. The carrier excitation layer 306 includes a lower spacer layer made of AlGaAs, an active layer made of a GaInAs quantum well layer/AlGaAs barrier layer, and an upper spacer layer made of AlGaAs. The carrier excitation layer 306 has an optical film thickness of one wavelength. On the carrier excitation layer 306, a first upper Bragg reflector 312 (hereinafter referred to as a first upper DBR 312) is disposed.

The first upper DBR 312 is formed by alternately laminating semiconductor materials having different refractive indices. Specifically, the first upper DBR 312 can be formed, for example, by laminating one pair of a p-$Al_{0.16}Ga_{0.84}$ As high-refractive-index layer and a p-$Al_{0.9}Ga_{0.1}$ As low-refractive-index layer such that each layer has an optical film thickness of $\frac{1}{4}$ wavelength. The number of pairs in the first upper DBR 312 may be more or less than one in order to achieve a desired reflectance, and the composition ratio of AlGaAs in the material system may be changed.

On the first upper DBR 312, a current constriction layer 304 made of AlAs is disposed. A peripheral portion of the current constriction layer 304 is a selectively oxidized region 305 formed by selective oxidization. The current constriction layer 304 that is not oxidized is disposed at the center.

On the current constriction layer 304 and the selectively oxidized region 305, a second upper Bragg reflector 303 (hereinafter referred to as a second upper DBR 303) is disposed. The second upper DBR 303 may be made of the same material system as that of the first upper DBR 312, and can be formed by laminating 40 pairs. The number of pairs in the second upper DBR 303 may be more or less than 40 pairs in order to achieve a desired reflectance, and the composition ratio of AlGaAs in the material system may be changed.

On the second upper DBR 303, a p-type contact layer 302 is disposed. The p-type contact layer 302 can be made of, for example, p-GaAs. The p-type contact layer 302 is connected to a p-electrode 301.

The light emitted by the light source 104 may have any wavelength as long as the light is not absorbed by the semiconductor substrate 101. For example, when the semiconductor substrate 101 is a SI—GaAs substrate, an emission wavelength in the 940 nm band or longer can be employed.

Such a structure obtained by laminating a plurality of layers on the semiconductor substrate 101 may be hereinafter referred to as a "laminate" for convenience. The laminate can be formed by, for example, metal organic chemical vapor deposition (MOCVD). Alternatively, molecular beam epitaxy (MBE) or the like may be used.

The light source 104 includes a dielectric film 311 made of silicon nitride. The dielectric film 311 protects mesa side walls and serves as a passivation film. The dielectric film 311 may be made of, instead of silicon nitride, silicon oxide or another dielectric material. The dielectric film 311 may be formed by, for example, plasma chemical vapor deposition, atomic layer deposition, or the like. The n-electrode 309 and the p-electrode 301 may be formed by vacuum deposition, plating, or the like by using an appropriate material.

The portion above the active layer may be formed using a dielectric material to form an appropriate contact layer, electrodes, and so forth, so as to obtain an intra-cavity surface emitting laser structure.

A description has been given of the case where the light source 104 is a surface emitting laser. Alternatively, the light source 104 may be a light-emitting diode structure. When the light source 104 is a light-emitting diode structure, a structure obtained by removing the lower DBR 307, the current constriction layer 304, the selectively oxidized region 305, the first upper DBR 312, and the second upper DBR 303 from the above-described structure is employed. To increase the efficiency of emission toward the substrate, the upper DBRs alone may be left, for example.

In the present embodiment, the light source 104 is formed on the semiconductor substrate 101, which is a GaAs substrate, by using materials such as AlGaAs and InGaAs. The semiconductor substrate 101 may be made of a material used for a typical semiconductor device, such as InP, GaN, Si, Ge, or sapphire, instead of GaAs. Any material, film thickness, and layer structure may be employed as long as a growth structure can be formed thereon by crystal growth.

The photodiode 206 has the same growth structure as that of the light source 104, and is formed by one crystal growth. Thus, the semiconductor substrate 101, the dielectric films 311 and 411, the n-type contact layers 308 and 408, the n-electrodes 309 and 409, the lower DBRs 307 and 407, the carrier excitation layers 306 and 406, the first upper DBRs 312 and 412, the current constriction layers 304 and 405, the second upper DBRs 303 and 403, the p-type contact layers 302 and 402, and the p-electrodes 301 and 401 in FIG. 4 are each the same in material and film thickness.

The photodiode 206 and the light source 104 have the same device structure except that patterning in a semiconductor process is different, and are simultaneously formed in one semiconductor process. When the light source 104 is a surface emitting laser, the photodiode 206 has the same growth structure (layer structure) as that of the light source 104. However, the current constriction layer 405 is not subjected to selective oxidization. When the light source 104 is a light-emitting diode structure, the photodiode 206 has the same structure as that of the light source 104.

FIG. 5 is a simplified cross-sectional view taken along the chain line D-D' in the sensitive portion 102 formed on the inclined mirror structure 105 in FIG. 3A. The inclined mirror structure 105 is disposed on the front surface (opposite to the crystal growth surface) of the semiconductor substrate 101.

The inclined mirror structure 105 is disposed at a position where light emitted by the light source 104 and propagated through the semiconductor substrate 101 is incident. The inclined mirror structure 105 has such a mirror angle that surface plasmon resonance occurs in the sensitive portion 102.

The inclined mirror structure 105 is formed by, for example, forming a three-dimensional photoresist mask on the front surface (the surface opposite to the crystal growth surface, i.e., the surface viewed in the +Z direction) of the semiconductor substrate 101 by gray scale exposure, and performing a dry etching process such as reactive ion etching or a wet etching process such as immersion in a mixed solution of sulfuric acid and a hydrogen peroxide solution. Alternatively, a mirror structure having a desired angle may be formed by selecting a specific off-angle of the substrate and using a change in etching rate for each crystal orientation.

On the semiconductor substrate 101, an antireflection coating 604 is disposed. The antireflection coating 604 may be formed by, for example, plasma chemical vapor deposition or atomic layer deposition with an appropriate material, configuration, and film thickness.

On the antireflection coating 604, a dielectric layer 603 is disposed. The dielectric layer 603 is made of, for example, silicon nitride with a film thickness of about 400 nm. The dielectric layer 603 may be made of silicon oxide or another dielectric material, and may have a single-layer structure or a multilayer structure.

The film thickness may be larger or smaller than 400 nm. The dielectric layer 603 may be formed by plasma chemical vapor deposition or the like.

On the dielectric layer 603, a metal layer 602 is disposed. The metal layer 602 includes a gold layer of 40 nm disposed on a chromium layer of 2 nm. The metal layer 602 may be made of aluminum, platinum, titanium, or other metal materials instead of chromium and gold. Each layer of the metal layer may be formed by vacuum deposition, sputtering, plating, or the like. An evanescent wave that excites a surface plasmon wave is generated at the interface between the dielectric layer 603 and the metal layer 602, and has a penetration depth of about 200 to 300 nm in the direction perpendicular to the semiconductor substrate 101. Thus, the metal layer 602 has a film thickness equal to or less than the penetration depth.

Alternatively, the metal layer 602 may be disposed so as to be in direct contact with the semiconductor substrate 101, with neither the antireflection coating 604 nor the dielectric layer 603 being provided. Other layers may be disposed as appropriate.

On the metal layer 602, a sensitive film 601 is disposed. The sensitive film 601 may be made of any of various materials and have any of various structures depending on a target to be sensed. An example of a case of forming a sensitive film used for sensing cortisol, which is generally called a stress hormone, will be described below. The sensitive film 601 includes two layers: a self-assembled monolayer and an antibody layer.

The self-assembled monolayer is disposed on the metal layer 602. The self-assembled monolayer is formed by stirring a self-assembled monolayer agent into ethanol adjusted to about pH 2 with concentrated hydrochloric acid, immersing a wafer therein, and allowing the wafer to stand in a dark room for about 48 hours. The wafer is then washed repeatedly with ethanol and dried with nitrogen.

The self-assembled monolayer agent has a thiol group on one side and a carboxyl group on the other side, and has a carbon chain of five or more carbon atoms. A gold surface of the metal layer 602 and the thiol group of the self-assembled monolayer agent form a Au—S bond to form a self-assembled monolayer on the surface. The wafer is immersed in a mixed solution of N-hydroxysuccinimide (NHS) and 1-ethyl-3-(3-dimethylaminopropyl)carbodiimide (EDC). As a result, the carboxyl group of the self-assembled monolayer is activated.

Antibodies that capture cortisol are stirred into a phosphate buffer solution, and the wafer is immersed in the solution. As a result, the activated carboxyl group and some of the antibodies bind to each other by amine coupling, and the antibodies are immobilized on the substrate.

The wafer is then immersed in an ethanolamine solution. Accordingly, the carboxyl group to which no antibodies have been bound can be inactivated. The wafer is washed with pure water and dried with nitrogen. With the above-described method, the sensitive film 601 that can be used for sensing cortisol can be formed. Alternatively, another type of self-assembled monolayer may be used, or a film of carboxymethyl dextran or the like may be formed instead of the self-assembled monolayer.

For a measurement target other than cortisol, an appropriate self-assembled monolayer, an appropriate antibody, and the like to be used may be selected for the measurement target and formed by an appropriate process. Instead of causing an antibody reaction to capture organic molecules, a method of capturing an organic substance on the gold surface and changing the refractive index in the vicinity of the gold surface may be used.

In the measurement device 100 according to the present embodiment, the light source 104, the sensitive portion 102, and the photodiode array 103 are disposed on the semiconductor substrate 101 so as to be integrated together. The light source 104 is an example of a light-emitting element. The photodiode array 103 is an example of a light-receiving element. The sensitive portion 102 is an example of a measurement portion. The semiconductor substrate 101, which is a GaAs substrate, is an example of a semiconductor substrate. Accordingly, a holding portion of the light-emitting element, the light-receiving element, and the measurement portion also serves as a light propagation path, and thus the measurement device 100 has a reduced size.

The measurement device 100 according to the present embodiment includes the semiconductor substrate 101; the light source 104 that is disposed on the semiconductor substrate 101 and that emits the light 106 into the semiconductor substrate 101; the sensitive portion 102 on which the light 106 that has passed through the semiconductor substrate 101 is incident as incident light and that reflects at least a part of the incident light as the reflected light 106'; and the photodiode array 103 that receives the reflected light 106' that has passed through the semiconductor substrate 101. Accordingly, the holding portion of the light source 104 also serves as a light propagation path, and thus the measurement device 100 has a reduced size.

The measurement device 100 according to the present embodiment includes the semiconductor substrate 101; the light source 104 that emits the light 106 into the semiconductor substrate 101; the sensitive portion 102 on which the light 106 that has passed through the semiconductor substrate 101 is incident as incident light and that reflects at least a part of the incident light as the reflected light 106'; and the photodiode array 103 that is disposed on the semiconductor substrate 101 and that receives the reflected light 106' that has passed through the semiconductor substrate 101. Accordingly, the holding portion of the photodiode array 103 also serves as a light propagation path, and thus the measurement device 100 has a reduced size.

In the measurement device 100 according to the present embodiment, the photodiode 103 is disposed on the semiconductor substrate 101. Accordingly, the holding portion of the photodiode array 103 also serves as the holding portion of the light source 104, and thus the measurement device 100 has a reduced size.

In the measurement device 100 according to the present embodiment, the semiconductor substrate 101, the light source 104, the photodiode array 103, and the sensitive portion 102 are integrated together. Accordingly, the light source 104 and the photodiode array 103 can be disposed close to each other, and main components of the measurement device 100 can be arranged with high density. Because the light source 104, the photodiode array 103, and the sensitive portion 102 are aligned with high accuracy, the measurement accuracy increases.

In the measurement device 100 according to the present embodiment, the light source 104 and the photodiode array 103 are disposed on the same surface of the semiconductor substrate 101 by film formation. As a result of a semiconductor process such as photolithography performed on the same plane, the relative positional accuracy of the light source 104 and the photodiode array 103 increases and the measurement accuracy increases.

The measurement device 100 according to the present embodiment is a surface plasmon resonance sensor in which the sensitive portion 102 includes the metal layer 602 that causes surface plasmon resonance. Accordingly, measurement with very high sensitivity can be performed using a surface plasmon resonance phenomenon.

In the measurement device 100 according to the present embodiment, the light source 104 is a surface emitting laser. Accordingly, direct incidence of light on the semiconductor substrate 101 can be performed, and thus the measurement device 100 having a reduced size can be provided.

A method of manufacturing the measurement device 100 according to the present embodiment includes forming the light source 104 on the semiconductor substrate 101 such that the light 106 is emitted by the light source 104 into the semiconductor substrate 101; and disposing the sensitive portion 102 on the semiconductor substrate 101 such that the light 106 that has passed through the semiconductor substrate 101 is incident on the sensitive portion 102.

A method of manufacturing the measurement device 100 according to the present embodiment includes disposing the sensitive portion 102 on the semiconductor substrate 101 such that the light 106 that has passed through the semiconductor substrate 101 is incident on the sensitive portion 102; and forming the photodiode array 103 on the semiconductor substrate 101 such that the reflected light 106' is received by the photodiode array 103, the reflected light 106' being generated as a result of the light 106 incident on the sensitive portion 102 being reflected by the sensitive portion 102.

In this method, the light source 104 included in the surface plasmon resonance sensor can be formed on the semiconductor substrate 101 serving as a light propagation path by a semiconductor process. In an existing miniaturization technique, a light source and a medium serving as a light propagation path are individually mounted, or chips are individually processed. Thus, miniaturization with a mountable size or a processable size is limited. On the other hand, in this method, the light source 104 is formed on the semiconductor substrate 101 serving as a light propagation path by a semiconductor process, and thus a measurement device smaller than an existing measurement device can be implemented.

In this method, the photodiode array 103 included in the surface plasmon resonance sensor can be formed on the semiconductor substrate 101 serving as a light propagation path by a semiconductor process. Accordingly, a measurement device smaller than an existing measurement device can be implemented.

In this method, the light source 104 and the photodiode array 103 included in the surface plasmon resonance sensor can be formed on the semiconductor substrate 101 serving as a light propagation path by a semiconductor process. Accordingly, a measurement device smaller than an existing measurement device can be implemented. Furthermore, as a result of forming the inclined mirror structure 105 and the sensitive portion 102 by a semiconductor process, a measurement device having a reduced size can be implemented with higher accuracy without individual mounting or processes for individual chips performed in an existing miniaturization technique.

Second Embodiment

Figure 6:
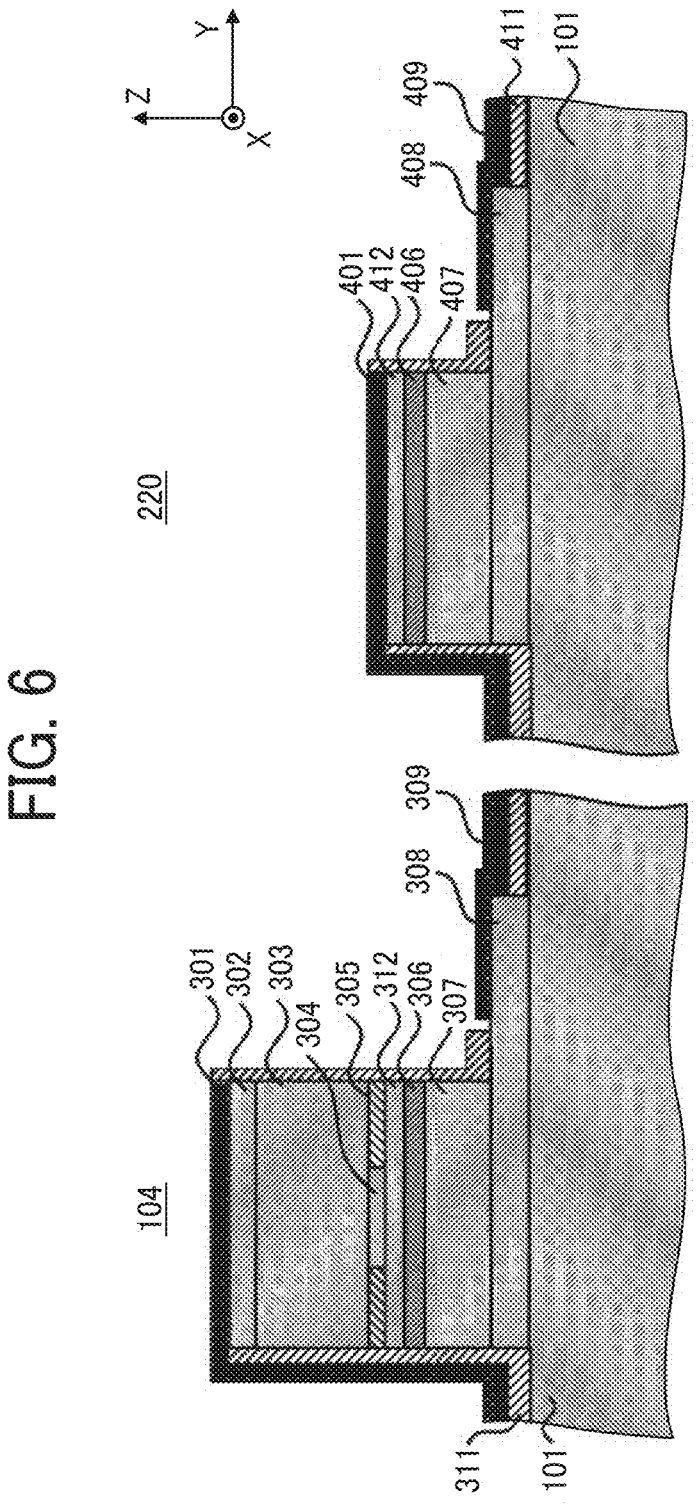
FIG. 6 is a partial cross-sectional view of a light source and a photodiode of a measurement device according to a second embodiment.

A schematic view of a second embodiment is illustrated in FIG. 6. FIG. 6 is a partial cross-sectional view illustrating the light source 104 and a photodiode 220 according to the present embodiment. The second embodiment employs a method of improving the performance of the surface plasmon resonance sensor by making the layer structure of the photodiode 220 different from that of the light source 104. In the present embodiment, a process of etching a photodiode portion may be added, a light source formation portion may be protected by a photoresist or the like after first crystal growth, and a desired photodiode structure may be formed by second crystal growth after the photodiode portion has been removed by etching.

Accordingly, reflection at a DBR and reflection due to a difference in refractive index between materials can be reduced, the amount of light incident on the photodiode can be increased, the SN ratio can be improved by reducing stray light, and the performance of the surface plasmon resonance sensor can be improved. Hereinafter, the present embodiment will be described in detail. The description does not limit the scope of the present disclosure.

Hereinafter, a description will be given of a difference from the first embodiment, that is, a partial change in the processing for making the layer structure of the photodiode different from that of the light source. The other structure and processing are the same as those of the first embodiment.

FIG. 6 is a partial cross-sectional view illustrating the light source 104 and the photodiode 220 according to the second embodiment, and illustrates the cross sections taken along the line A-A' in FIG. 3B and the line B-B' in FIG. 3B. FIG. 6 is simplified for the description of the present embodiment, and a detailed description of a layer structure and so forth is omitted for convenience.

Referring to FIG. 6, the light source 104 and the photodiode 220 have partially the same layer structure. The semiconductor substrate 101, the dielectric films 311 and 411, the n-type contact layers 308 and 408, the n-electrodes 309 and 409, the lower DBRs 307 and 407, the carrier excitation layers 306 and 406, the first upper DBRs 312 and 412, and the p-electrodes 301 and 401 are each the same in material and film thickness.

The first upper DBRs 312 and 412 are made of a material system different from that of the layers thereabove. For example, the layers above the first upper DBRs 312 and 412 are made of AlAs, AlGaAs, or GaAs, and the first upper DBRs 312 and 412 are made of GaInP, AlGaInP, or the like. An AlAs layer, an AlGaAs layer, and a GaAs layer have a property of being etched with a mixed solution of sulfuric acid and a hydrogen peroxide solution. A GaInPlayer and an AlGaInP layer have a property of not being etched with a mixed solution of sulfuric acid and a hydrogen peroxide solution. Such a layer having etching selectivity may be hereinafter referred to as an etch stop layer.

Thus, after crystal growth, the light source portion is protected by a photomask or the like, and etching is selectively performed to the interface between the first upper DBRs 312 and 412 and the selectively oxidized region 305. Subsequently, processing is performed in a manner similar to that in the first embodiment, and thereby the photodiode 220 is formed.

The first upper DBRs 312 and 412 and the layers thereabove may be made of other materials as long as etching selectivity can be secured. The mixed solution used for etching may be, for example, a mixed solution of phosphoric acid and a hydrogen peroxide solution, or another mixed solution as long as etching selectivity can be secured. A layer having etching selectivity may be formed in a place other than the first upper DBRs 312 and 412, for example, in a middle of the second upper DBR 303 or in another layer.

Also when the light source 104 is a light-emitting diode structure, a layer having etching selectivity may be provided and formed at a certain position.

In the measurement device 100 according to the present embodiment, the light source 104 includes the p-type contact layer 302, the carrier excitation layer 306, and the n-type contact layer 308 closer to the semiconductor substrate 101 than the p-type contact layer 302. The photodiode array 103 includes the p-type contact layer 402, the carrier excitation layer 406, and the n-type contact layer 408 closer to the semiconductor substrate 101 than the p-type contact layer 402. At least the n-type contact layer 308 and the n-type contact layer 408 are made of the same material. Accordingly, the simultaneous crystal growth makes it possible to employ a low-cost manufacturing method and provide a low-cost compact measurement device.

A method of manufacturing the measurement device 100 according to the present embodiment includes simultaneously forming the light source 104 and the photodiode array 103 on the semiconductor substrate 101 by crystal growth; and removing a part of the photodiode array 103 by selective etching.

In the present embodiment, the layers of the photodiode 220 are partially removed by processing to increase the intensity of light incident on the photodiode 220. For example, removal of the second upper DBR 303 makes it possible to decrease the reflectance and increase the intensity of light incident on the photodiode 220. The reduction in unnecessary reflected light reduces a stray light component and improves the SN ratio of detection. Accordingly, the measurement accuracy of the surface plasmon resonance sensor can be increased.

Third Embodiment

In a third embodiment, a photodiode 230 undergoes processing and second crystal growth so as to have a layer structure partially different from that of the light source 104. The other structure and processing not described below are the same as those of the first embodiment.

Figure 7:
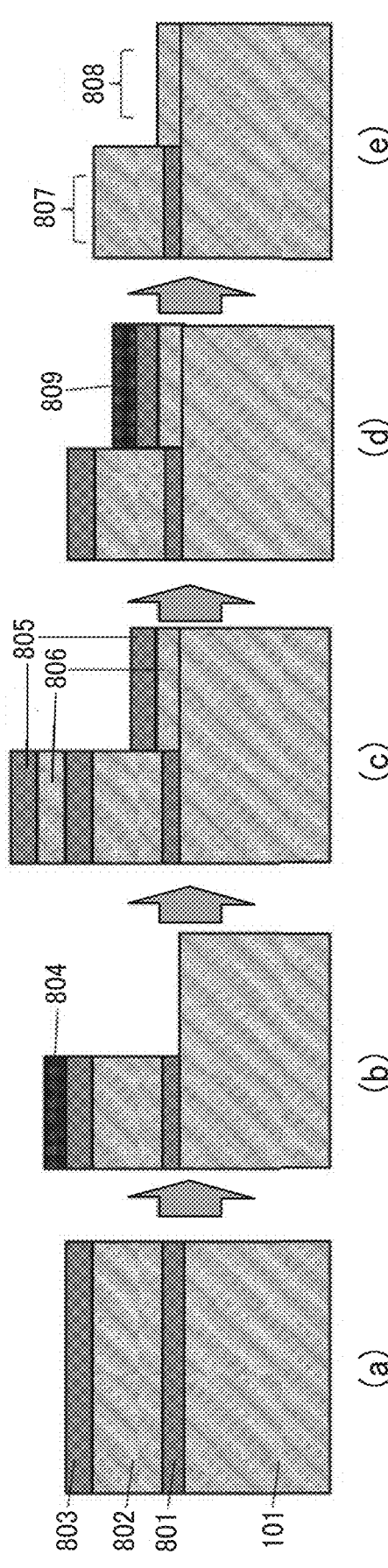
FIG. 7 is a schematic view (cross-sectional view) for describing a method of manufacturing a measurement device according to a third embodiment.

FIG. 7 illustrates schematic views of the cross-section of a region for forming the light source 104 and the photodiode 230 and a processing flow according to the third embodiment. FIG. 7 is simplified for the description of the present embodiment, and a detailed description of a layer structure and so forth is omitted for convenience.

Figure 8:
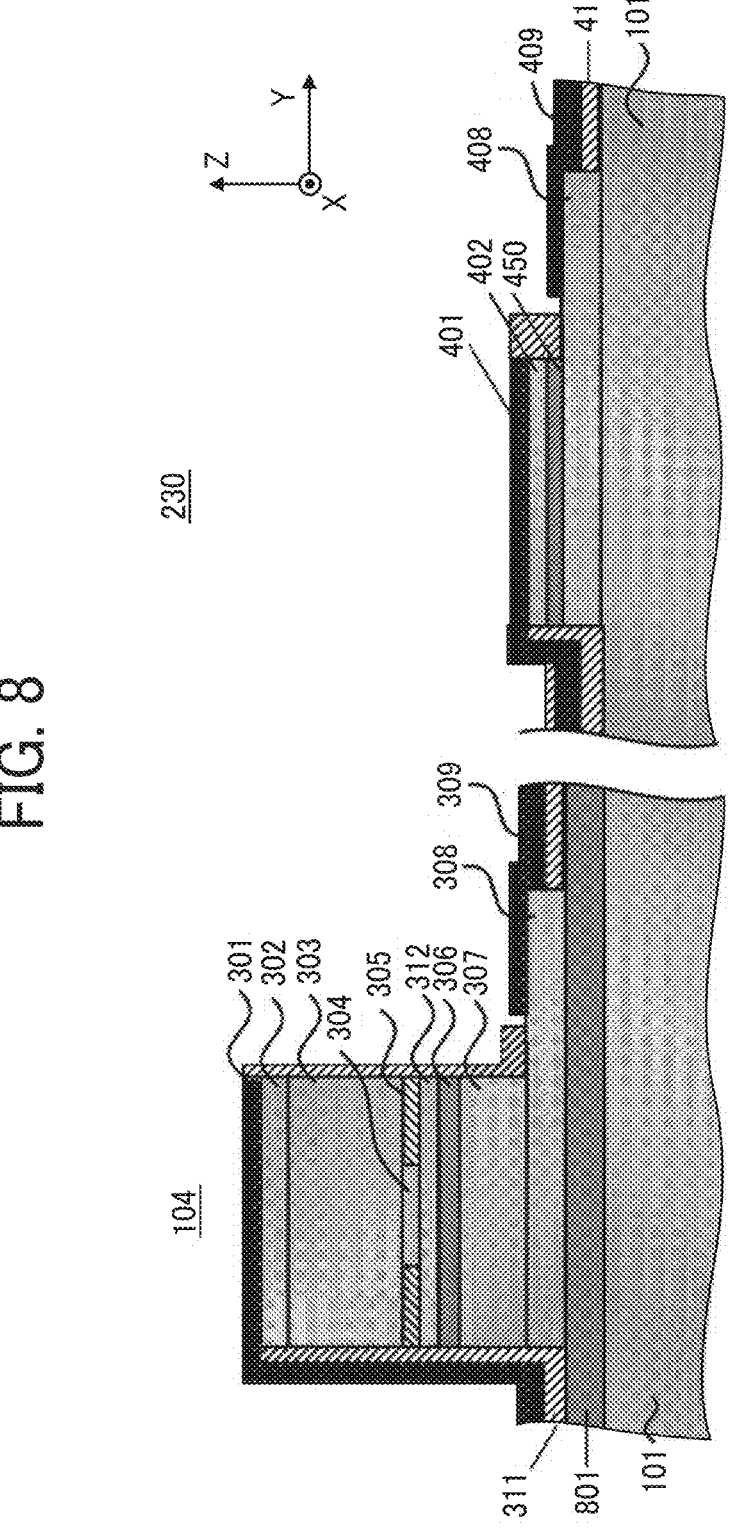
FIG. 8 is a partial cross-sectional view of a light source and a photodiode of the measurement device according to the third embodiment.

FIG. 8 is a partial cross-sectional view illustrating the light source 104 and the photodiode 230 according to the third embodiment, and illustrates the cross sections taken along the line A-A' in FIG. 3B and the line B-B' in FIG. 3B. FIG. 8 is simplified for the description of the present embodiment, and a detailed description of a layer structure and so forth is omitted for convenience.

Part (a) of FIG. 7 is a schematic view of a layer structure obtained by performing first crystal growth on the semiconductor substrate 101. An etch stop layer 801 is disposed on the semiconductor substrate 101. The etch stop layer 801 is made of, for example, GaInP, AlGaInP, or the like. The etch stop layer 801 may be made of another material having etching selectivity.

On the etch stop layer 801, a light source layer 802 forming a light source structure is disposed. The light source layer 802 is made of, for example, an AlGaAs layer, an AlAs layer, a GaAs layer, an InGaAs layer, an AlInGaAs layer, a GaAsP layer, or the like. The light source layer 802 includes layers such as a DBR layer, a resonance region, and a contact layer in the case of a surface emitting laser structure, and includes layers such as a contact layer and a light-emitting layer in the case of a light-emitting diode structure.

On the light source layer 802, an etch stop layer 803 is disposed. The etch stop layer 803 is made of, for example, GaInP, AlGaInP, or the like. The etch stop layer 803 may be made of another material having etching selectivity.

Part (b) of FIG. 7 is a schematic view of a layer structure obtained by performing photolithography and selective etching. A photoresist 804 is formed in a light source formation region by, for example, photolithography. The etch stop layer 803, the light source layer 802, and the etch stop layer 801 are subjected to selective etching. The etch stop layers 803 and 801 are subjected to selective etching with, for example, diluted hydrochloric acid. The light source layer 802 is subjected to selective etching with, for example, a mixed solution of sulfuric acid and a hydrogen peroxide solution. Another chemical solution may be used for etching as long as selective etching can be performed.

Part (c) of FIG. 7 is a schematic view of a layer structure obtained by performing second crystal growth after the photoresist 804 has been peeled off. The photoresist 804 is peeled off using, for example, a peeling solution. Instead of the peeling solution, an organic solvent such as acetone may be used. Subsequently, a wafer is introduced into a crystal growth device again, and a photodiode layer 806 and an etch stop layer 805 are formed by second crystal growth. The photodiode layer 806 includes a layer that absorbs light and excites carriers, and is made of, for example, an AlGaAs layer, a GaAs layer, an InGaAs layer, a GaInAsP layer, or the like. Another material may be used as long as the function of a photodiode can be exhibited. The etch stop layer 805 is made of the same material as that of the etch stop layers 801 and 803.

Part (d) of FIG. 7 is a schematic view of a layer structure obtained by performing photolithography and selective etching. A photoresist 809 is formed in a photodiode formation region by, for example, photolithography. The etch stop layer 805 and the photodiode layer 806 are subjected to selective etching. The selective etching of each layer is performed by a method similar to the method of selective etching for the light source layer 802 and the etch stop layers 801 and 803.

Part (e) of FIG. 7 is a schematic view of a layer structure obtained by performing selective etching after the photoresist 809 has been peeled off. The photoresist 809 is peeled off by a method similar to the peeling of the photoresist 804. The selective etching of the etch stop layers 803 and 805 is performed by a method similar to the method of selective etching for the etch stop layers 801 and 803.

After the above-described processing has been performed, the light source 104 and the photodiode 230 are formed in a light source formation region 807 and a photodiode formation region 808 by processing similar to that in the first embodiment. The light source 104 and the photodiode 230 may be formed by individual processing operations as appropriate.

A GaInP layer, an AlGaInP layer, or the like may be used for a part of the light source layer 802. In this case, processing such as selective etching may be additionally performed as appropriate.

FIG. 8 illustrates the light source 104 and the photodiode 230 according to the present embodiment. The light source 104 is a surface emitting laser as in the first embodiment. The photodiode 230 will be described below.

The n-type contact layer 408 is disposed on the semiconductor substrate 101. The n-type contact layer 408 is made of, for example, n-GaAs.

On the n-type contact layer 408, a carrier excitation layer 450 is disposed. The carrier excitation layer 450 is made of, for example, InGaAs. Another material system may be used as long as light absorption and carrier excitation can be caused with respect to the wavelength that is used. On the carrier excitation layer 450, the p-type contact layer 402 is disposed. The p-type contact layer 402 is made of, for example, p-GaAs.

A method of manufacturing the measurement device 100 according to the present embodiment includes forming the light source 104 on the semiconductor substrate 101 and forming the photodiode array 103 on the semiconductor substrate 101.

In the measurement device 100 according to the present embodiment, the light source 104 and the photodiode array 103 each include a corresponding one of the carrier excitation layers (306, 450). The carrier excitation layers 306 and 450 have different film thicknesses or are made of different materials. Accordingly, the lower contact layers can be simultaneously formed by crystal growth. Thus, an increased light-reception sensitivity can be achieved by using film thicknesses and materials optimal to receive light for a light-receiving element individually crystal-grown, while a method of realizing a low cost is used as a manufacturing method. Highly accurate measurement can be performed by using the highly sensitive light-receiving element.

A method of manufacturing the measurement device 100 according to the present embodiment includes simultaneously forming the light source 104 and the photodiode array 103 on the semiconductor substrate 101 by crystal growth; and removing a part of the photodiode array 103 by selective etching.

With this method, the carrier excitation layer 450 of the photodiode 230 can be made with a material and film thickness different from those of the light source 104. Thus, for example, the film thickness of the carrier excitation layer 450 can be increased to increase carrier generation efficiency, or the difference in refractive index to the carrier excitation layer 450 can be reduced to reduce unintended reflection of light incident on the photodiode 230, and thereby an increase in light intensity and a decrease in stray light can be achieved. Accordingly, higher accuracy of the surface plasmon resonance sensor can be realized.

Fourth Embodiment

Figures 9A, 9B:
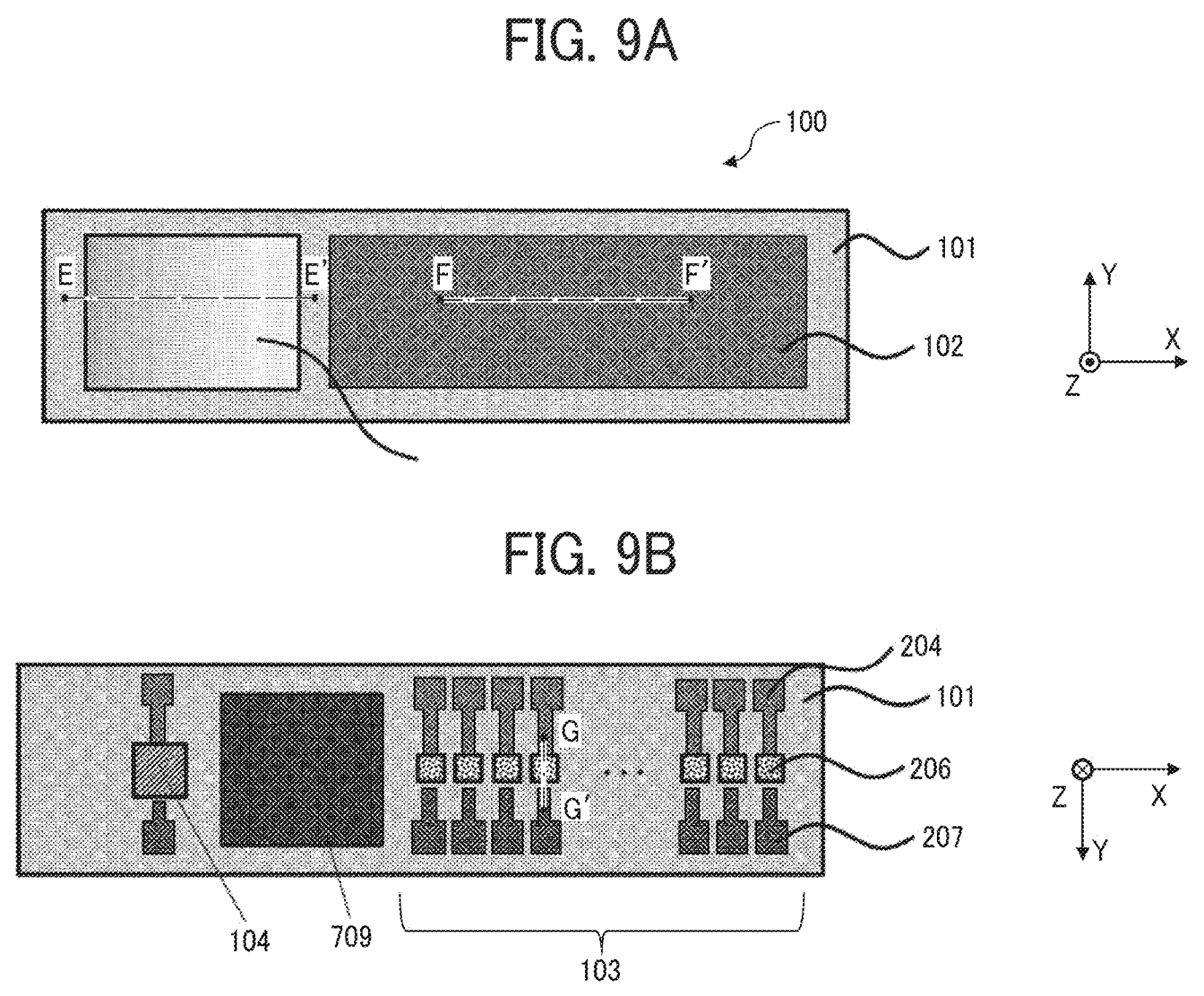
Figure 10:
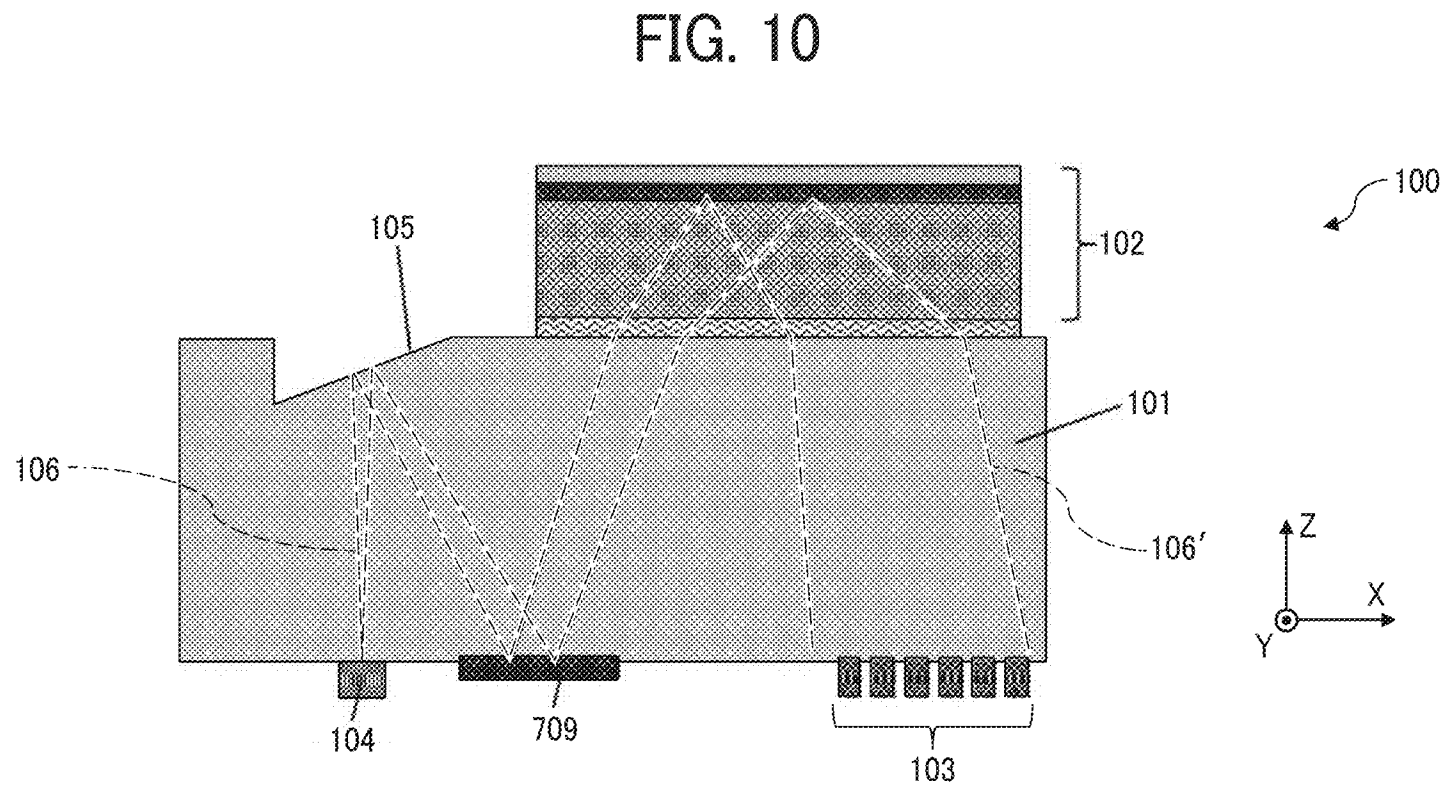

FIGS. 9A, 9B, and 10 illustrate the measurement device 100 according to a fourth embodiment. The propagation distance in the semiconductor substrate 101 is increased to increase measurement accuracy. The distance over which light propagates in an optical path after surface plasmon resonance has occurred in the sensitive portion 102 may be increased. The light from the light source 104 has a divergence angle. Thus, as the propagation distance increases, the area of a reflected waveform projected on the photodiode array 103 increases. Because the number of photodiodes contributing to measurement increases, estimation accuracy increases, and the performance of the surface plasmon sensor is improved.

As a result of increasing the propagation distance, the amount of change in the coordinates of light incident on the photodiode array 103 caused by a change in the resonance angle when organic molecules are captured by the sensitive portion 102 increases, and the accuracy of the surface plasmon resonance sensor increases.

The mirror structure and the sensitive portion 102 may be separated from each other as appropriate. Alternatively, a plurality of mirror structures may be additionally formed to cause light to be reflected a plurality of times in the semiconductor substrate 101, and increase the propagation distance. In an embodiment of the present disclosure in which a semiconductor substrate is used as an optical path, it is difficult to increase the propagation distance as compared with a method in which light is incident on a light-transmitting medium having a large volume as in the related art. Depending on the detection efficiency and spatial resolution of a photodiode array, a desired performance of a surface plasmon resonance sensor is not achieved. In this case, light is caused to be reflected a plurality of times in the substrate and the propagation distance is increased, and thus the performance of the sensor can be improved.

Hereinafter, the present embodiment will be described in detail. The description does not limit the scope of the present disclosure.

In the present embodiment, as illustrated in FIG. 10, the inclined mirror structure 105 and the sensitive portion 102 are individually formed, and a second mirror structure 709 is formed between the light source 104 and the photodiode array 103. The other structure and processing not described below are the same as those of any one of the first to third embodiments.

FIGS. 9A and 9B are plan views illustrating the measurement device 100 (surface plasmon resonance sensor) according to the fourth embodiment. FIGS. 9A and 9B are simplified for the description of the present embodiment. The scale, the number of constituent elements, and so forth illustrated in the figures are different from those of the actual configuration for convenience.

FIG. 10 is a schematic view of the configuration of a surface plasmon resonance sensor proposed by the present disclosure when a back-emission surface emitting laser according to the fourth embodiment is used. FIG. 10 is simplified for the description of the present embodiment. The scale, the number of constituent elements, and so forth illustrated in the figure are different from those of the actual configuration for convenience.

Figure 11:
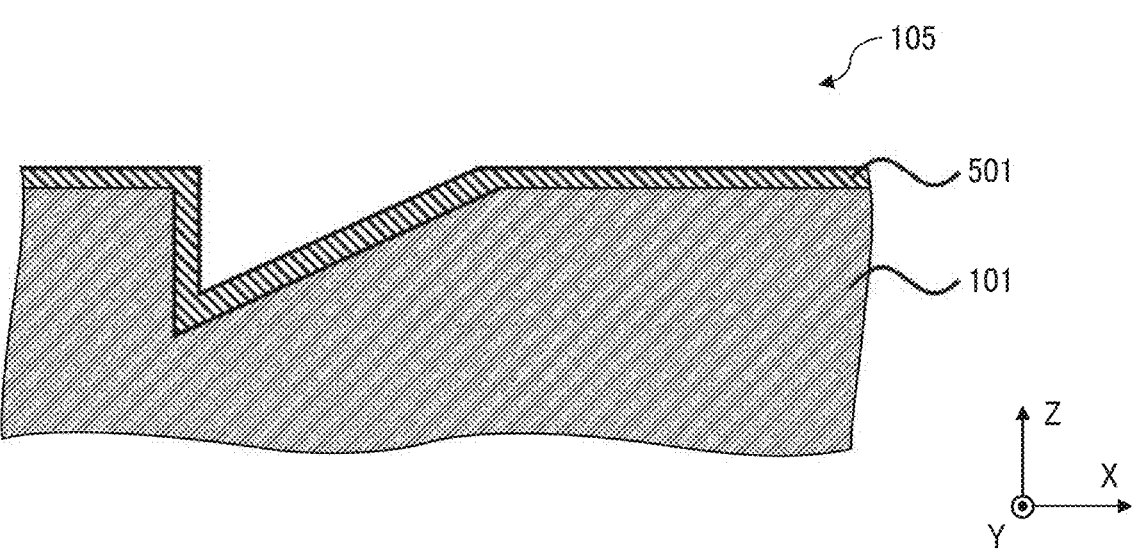
FIG. 11 is a partial cross-sectional view illustrating a mirror structure according to the fourth embodiment.

FIG. 11 is a partial cross-sectional view illustrating the inclined mirror structure 105 according to the fourth embodiment, and illustrates the cross section taken along the line E-E' in FIG. 9A. FIG. 11 is simplified for the description of the present embodiment, and a detailed description of a layer structure and so forth is omitted for convenience.

Figure 12:
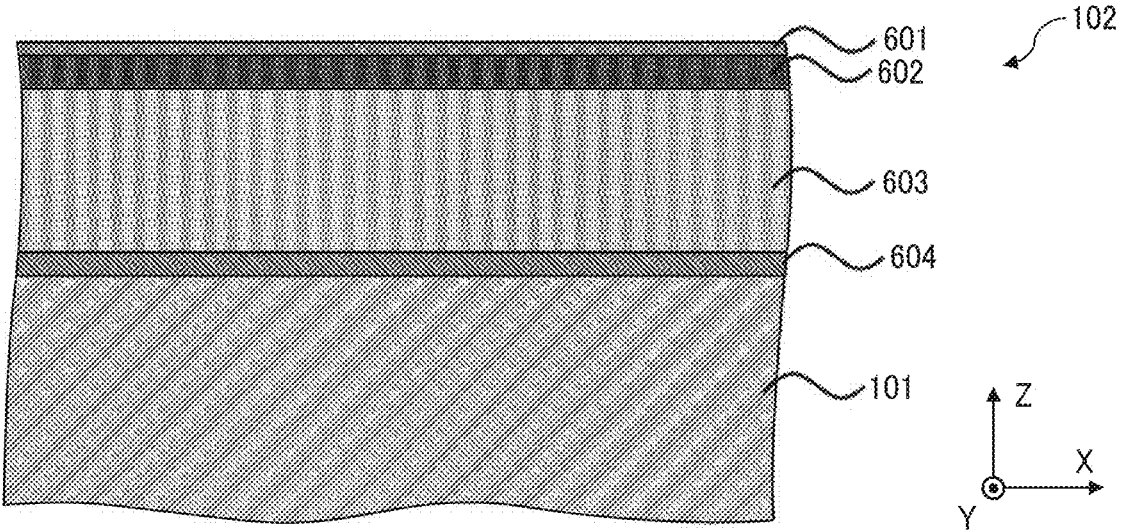
FIG. 12 is a partial cross-sectional view illustrating a sensitive portion of the measurement device according to the fourth embodiment.
Figures 13A, 13B:
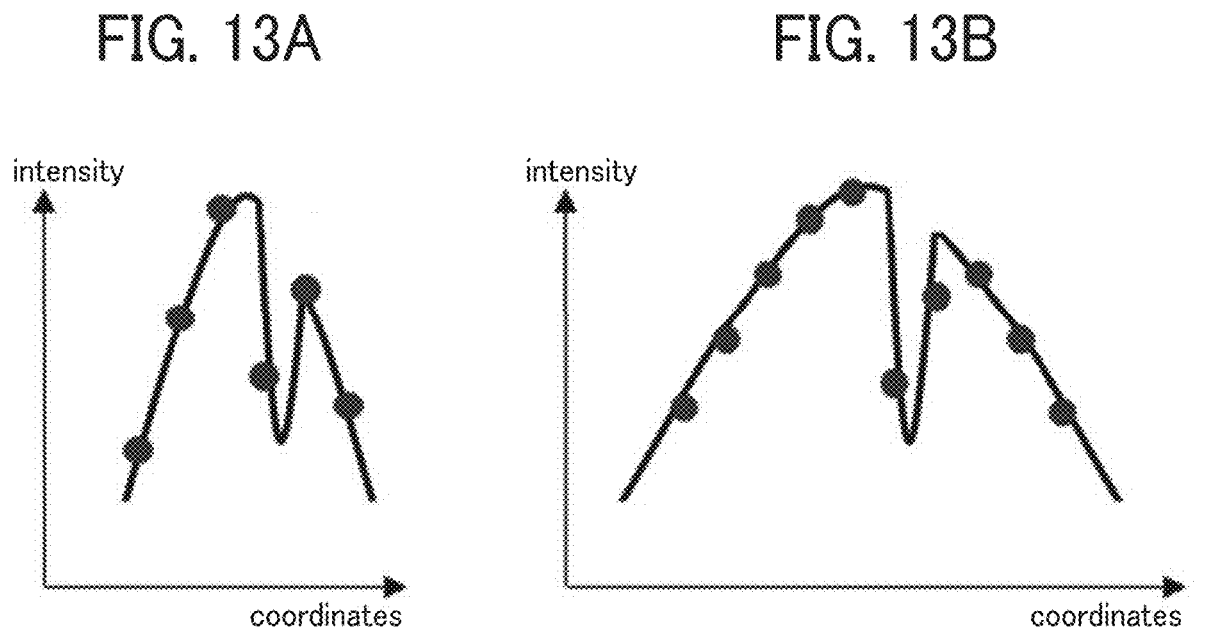

FIG. 12 is a partial cross-sectional view illustrating the sensitive portion 102 according to the fourth embodiment, and illustrates the cross section taken along the line F-F' in FIG. 9A. FIG. 12 is simplified for the description of the present embodiment, and a detailed description of a layer structure and so forth is omitted for convenience. FIGS. 13A and 13B are schematic views of signal waveforms projected on the photodiode according to a comparative example and the fourth embodiment, which are simplified for convenience.

FIGS. 9A and 9B illustrate the structure according to the fourth embodiment. In the present embodiment, the light source 104, the inclined mirror structure 105, the second mirror structure 709, the sensitive portion 102, and the photodiodes 206 are disposed in an array on the semiconductor substrate 101. The light source 104 and the photodiodes 206 are each connected to the p-electrode 204 and the n-electrode 207. The light source 104 may be a plurality of light sources arranged in an array.

The photodiode array 103 may be arranged two-dimensionally.

The light emitted by the light source 104 in FIG. 10 is reflected by the inclined mirror structure 105 and travels straight through the semiconductor substrate 101. Subsequently, the light is reflected by the second mirror structure 709 and is incident on the sensitive portion 102. Surface plasmon resonance occurs in the sensitive portion 102 and is detected by the photodiode array 103.

The inclined mirror structure 105 in FIG. 11 is disposed at a position where light emitted by the light source 104 is incident, and has such a mirror angle that surface plasmon resonance occurs in the sensitive portion 102. The inclined mirror structure 105 is formed, for example, by forming a three-dimensional photoresist mask on the front surface (the surface opposite to the crystal growth surface) of the semiconductor substrate 101 by gray scale exposure, and performing a dry etching process such as reactive ion etching or a wet etching process such as immersion in a mixed solution of sulfuric acid and a hydrogen peroxide solution.

Alternatively, a mirror structure having a desired angle may be formed by selecting a specific off-angle of the substrate and using a change in etching rate for each crystal orientation. On the inclined mirror structure 105, for example, a reflective metal layer 501 for increasing the reflectance is disposed. The reflective metal layer 501 may be made of a material used for forming the sensitive portion 102. In this case, the reflective metal layer 501 can be formed simultaneously with the sensitive portion 102.

The reflective metal layer 501 may be made of an appropriate dielectric material instead of metal, and may have a single-layer structure or a multilayer structure having an appropriate film thickness. Alternatively, nothing may be disposed on the inclined mirror structure 105, and the inclined mirror structure 105 may use a difference in refractive index from air. Alternatively, the inclined mirror structure 105 may have a diffraction grating shape.

The semiconductor substrate 101, which is a parallel plate, has the inclined mirror structure (reflection surface) 105 with a certain angle. As a result of inclining the reflection surface, the light emitted in a direction perpendicular to the semiconductor substrate 101 (Z direction) can be bent. Accordingly, the light can be efficiently guided to the second mirror structure 709 and the sensitive portion 102 without wasting the light. Eventually, the light can be received by the light receiving portion with high intensity. Accordingly, the sensitivity of the sensitive portion 102 increases, and a highly accurate measurement device can be provided.

FIG. 12 is a schematic cross-sectional view of the sensitive portion 102. The sensitive portion 102 includes the antireflection coating 604 disposed on the semiconductor substrate 101. The antireflection coating 604 is formed by plasma chemical vapor deposition, atomic layer deposition, or the like with an appropriate material, configuration, and film thickness.

On the antireflection coating 604, the dielectric layer 603 is disposed. The dielectric layer 603 is made of, for example, silicon nitride with a film thickness of about 400 nm. The dielectric layer 603 may be made of silicon oxide or another dielectric material, and may have a single-layer structure or a multilayer structure.
The film thickness may be larger or smaller than 400 nm. The dielectric layer 603 may be formed by plasma chemical vapor deposition or the like.

On the dielectric layer 603, the metal layer 602 is disposed. The metal layer 602 includes a gold layer of 40 nm disposed on a chromium layer of 2 nm. The metal layer 602 may be made of aluminum, platinum, titanium, or other metal materials instead of chromium and gold. Each layer of the metal layer may be formed by vacuum deposition, sputtering, plating, or the like. An evanescent wave that excites a surface plasmon wave is generated at the interface between the dielectric layer 603 and the metal layer 602, and has a penetration depth of about 200 to 300 nm in the direction perpendicular to the semiconductor substrate 101. Thus, the metal layer 602 has a film thickness equal to or less than the penetration depth. Alternatively, the metal layer 602 may be disposed so as to be in direct contact with the semiconductor substrate 101, with neither the antireflection coating 604 nor the dielectric layer 603 being provided.

The second mirror structure 709 includes a metal layer. The metal layer may be made of a material used for forming the electrodes of the light source 104 and the photodiode 206, and can be formed simultaneously with the electrodes.

The metal layer may be replaced with a single-layer structure or a multilayer structure made of an appropriate dielectric material and having an appropriate film thickness. Alternatively, nothing may be formed, and a mirror using a difference in refractive index from air may be used. Alternatively, a structure obtained by leaving a lower DBR during processing of a surface emitting laser may be used as a mirror.

The light source 104 and the photodiode 206 may have the same structure as described in the first embodiment, or may have different layer structures as described in the second or third embodiment.

In the measurement device 100 according to the present embodiment, the light 106 and 106' emitted by the light source 104 is reflected at least twice or more on the surface of the semiconductor substrate 101.

Depending on the arrangement pitch of the photodiode array 103, light may insufficiently spread on the photodiode array 103. Accordingly, a measurement coordinate interval is small with respect to a signal waveform, and sufficient waveform estimation is not performed, so that the measurement accuracy may decrease. FIG. 13A illustrates a case where light is incident on a photodiode array without being reflected even once in a GaAs substrate after being reflected by a sensitive portion (a case where the propagation distance is short). FIG. 13B illustrates a case where light is reflected by the inclined mirror structure 105 and the second mirror structure 709 and the area of the light projected on the photodiodes 206 is increased (a case where the propagation distance is long). The comparison between the two figures will be described below.

FIG. 13A is a graph illustrating a waveform of surface plasmon resonance according to a comparative example. FIG. 13B is a graph illustrating a waveform of surface plasmon resonance according to the fourth embodiment. In FIGS. 13A and 13B, a black line indicates the waveform of surface plasmon resonance that has occurred, and round dots indicate measurement points on a photodiode array.

When the propagation distance is short, the number of measurement points in the entire waveform is small depending on the arrangement pitch of the photodiode array. When the propagation distance is long, the number of measurement points in the entire waveform increases. Fitting or the like is performed from these measurement points, a waveform is estimated, and a change in the resonance angle is calculated. As the propagation distance increases, the number of measurement points effective for waveform estimation in the entire waveform increases, and thus the estimation accuracy increases. The increase in the propagation distance improves the performance of the surface plasmon resonance sensor.

Fifth Embodiment

Figures 14A, 14B:
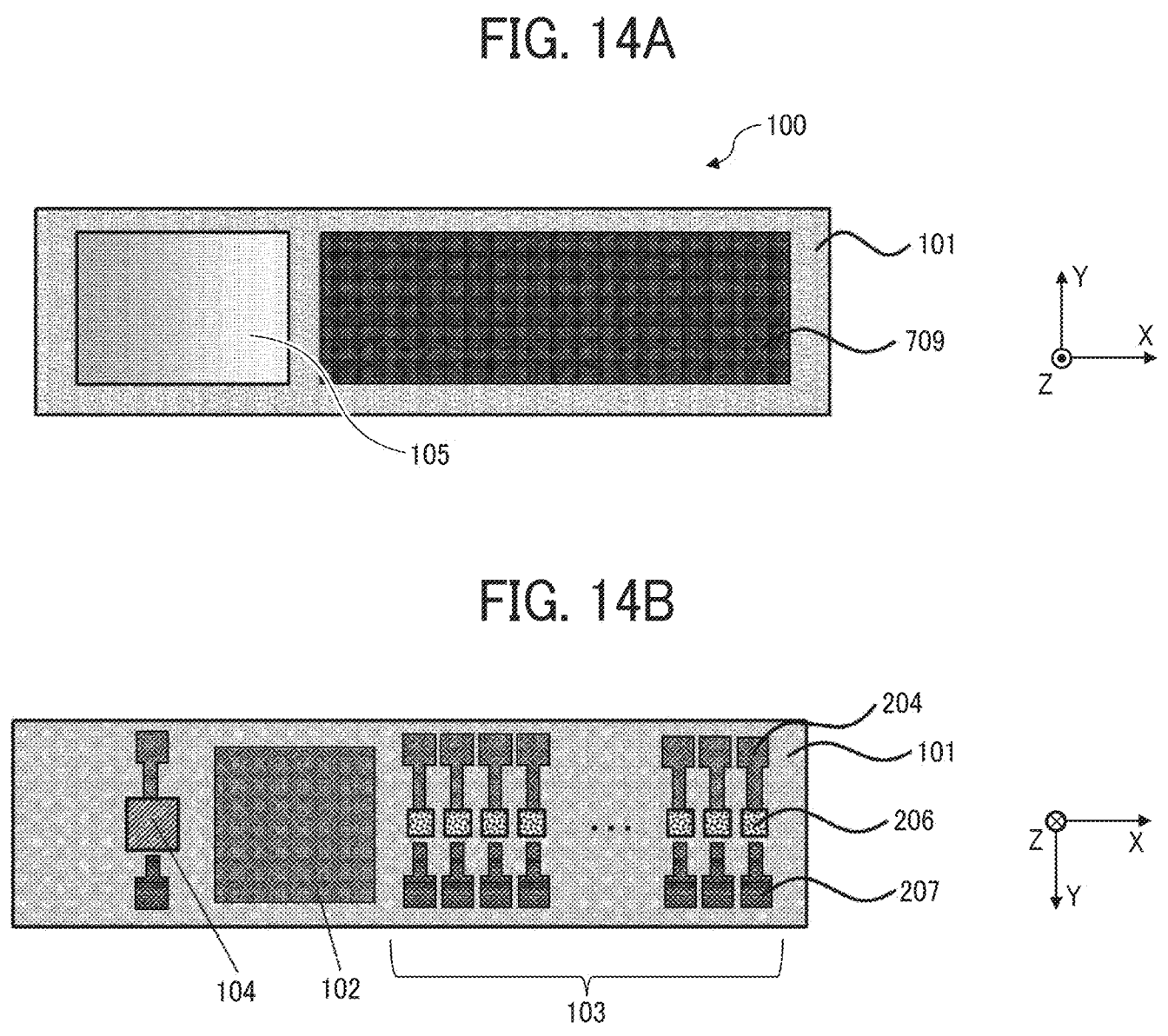
Figure 15:
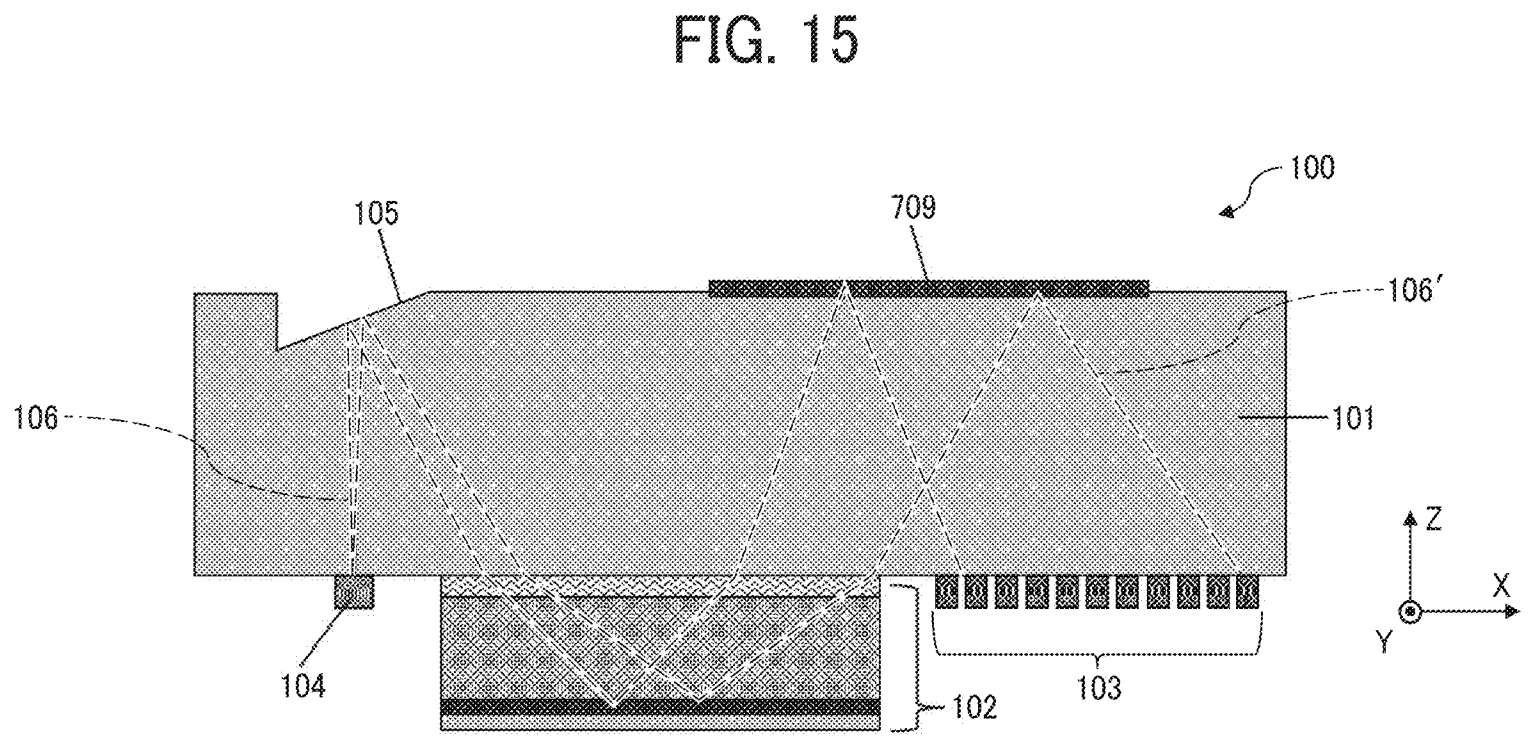

FIGS. 14A, 14B, and 15 are schematic views of the measurement device 100 according to a fifth embodiment. In the present embodiment, the inclined mirror structure 105 and the sensitive portion 102 are individually formed, the sensitive portion 102 is formed between the light source 104 and the photodiode array 103, and the second mirror structure 709 is formed on the front surface of the semiconductor substrate 101. The other structure and processing not described in the present embodiment are the same as those of any one of the first to fourth embodiments.

FIGS. 14A, 14B, and 15 are simplified for the description of the present embodiment. The scale, the number of constituent elements, and so forth illustrated in the figures are different from those of the actual configuration for convenience.

In the present embodiment, the light source 104, the inclined mirror structure 105, the sensitive portion 102, the second mirror structure 709, and the photodiodes 206 are disposed in an array on the semiconductor substrate 101. The light source 104 and the photodiodes 206 are each connected to the p-electrode 204 and the n-electrode 207. The light source 104 may be a plurality of light sources arranged in an array. The photodiode array 103 may be arranged two-dimensionally.

Sixth Embodiment

Figure 16:
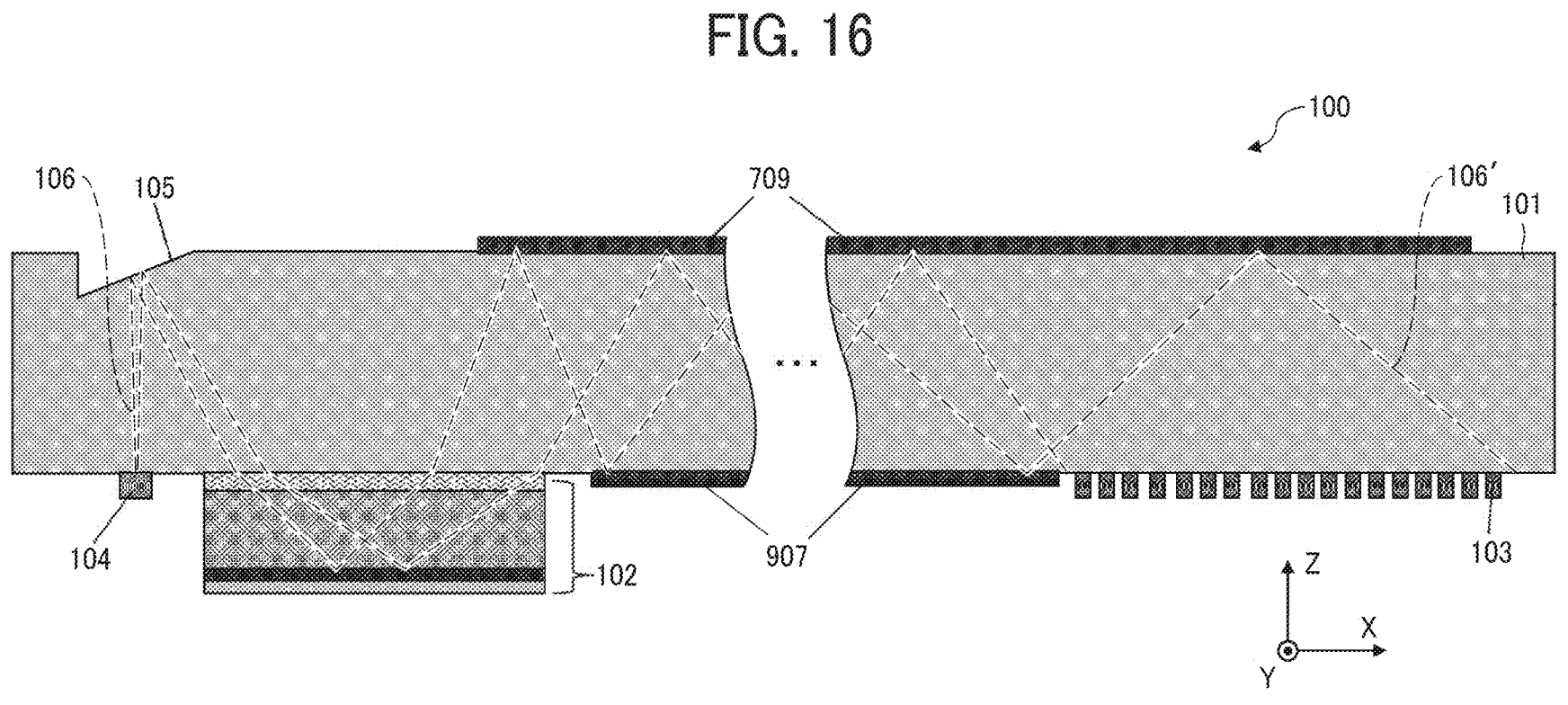

FIG. 16 is a schematic view of the configuration of the measurement device 100 according to a sixth embodiment. FIG. 16 is simplified for the description of the present embodiment. The scale, the number of constituent elements, and so forth illustrated in the figure are different from those of the actual configuration for convenience.

In the present embodiment, reflected light generated by surface plasmon resonance in the sensitive portion 102 travels straight through the semiconductor substrate 101, is reflected by the second mirror structure 709 disposed on the front surface of the semiconductor substrate 101, is reflected a plurality of times by a third mirror structure 907, and is received by the photodiode array 103. To further increase the propagation distance, a configuration that causes light to be reflected a plurality of times in the semiconductor substrate 101 is employed. The third mirror structure 907 may have a structure similar to or different from that of the second mirror structure 709.

In the present embodiment, even when the sensitive portion 102 is disposed on the front surface of the semiconductor substrate 101 as in the fourth embodiment, or when the sensitive portion 102 is disposed on the mirror structure as in the first embodiment, the second mirror structure 709 and the third mirror structure 907 may be disposed at positions where reflected light can be reflected a plurality of times in the semiconductor substrate 101.

In the measurement device 100 according to the present embodiment, the light 106 and 106' emitted by the light source 104 is reflected at least twice or more on the surface of the semiconductor substrate 101.

In the fifth and sixth embodiments, the distance over which the reflected light generated by surface plasmon resonance in the sensitive portion 102 propagates through the semiconductor substrate 101 is longer than in the first to fourth embodiments. A change in the resonance angle due to organic molecules captured by the sensitive portion 102 is detected, with the amount of change in the coordinates of light incident on the photodiode array 103 being increased as the propagation distance increases. This improves the performance of the surface plasmon resonance sensor. In this method, although the restrictions on the processing, the mounting form, the cost, and the like are larger than those in the first to fourth embodiments, an optimum number of times of reflection may be set within a range in which these restrictions are allowed.

Seventh Embodiment

Figure 17:
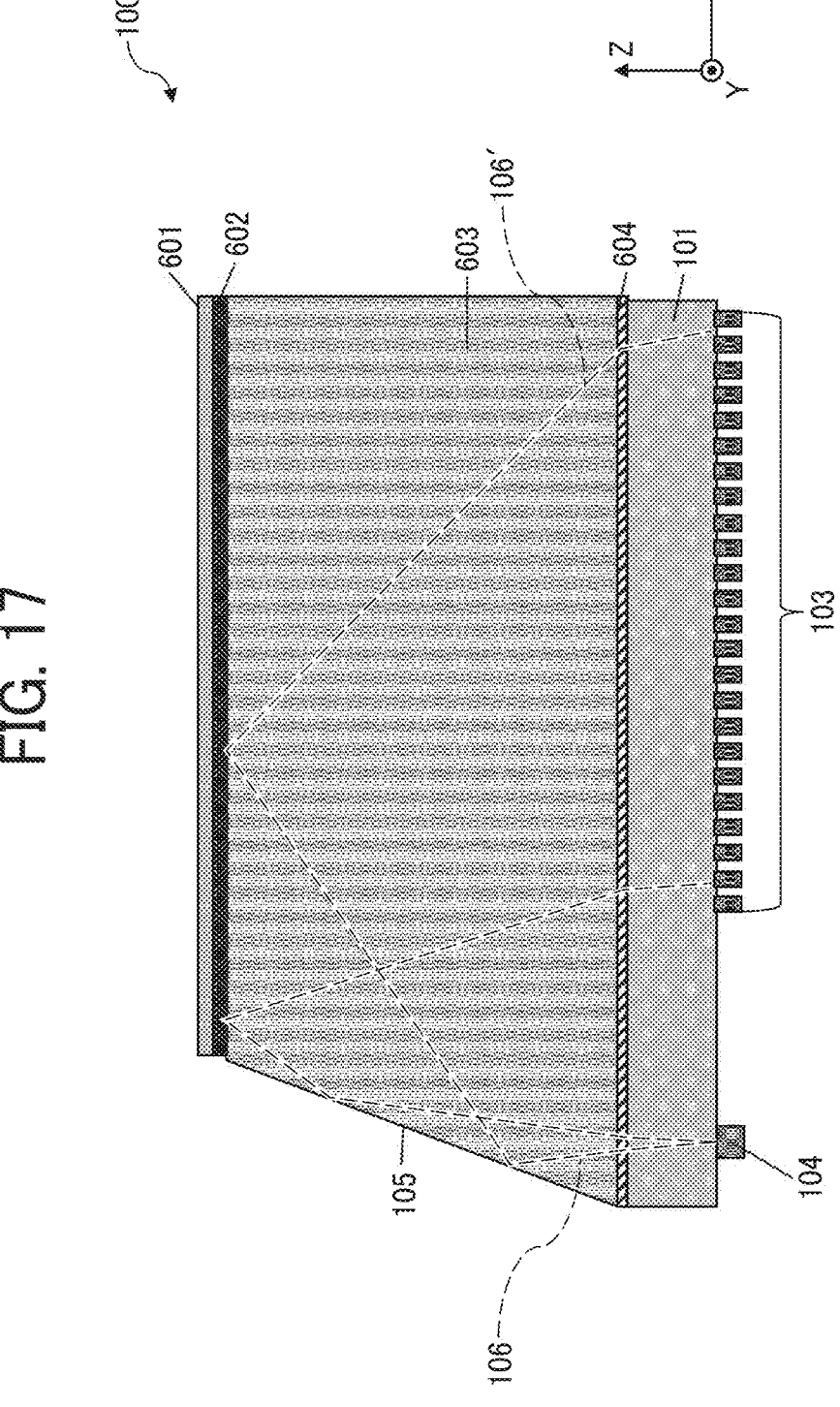
FIG. 17 is a schematic view (cross-sectional view) of a measurement device according to a seventh embodiment.

FIG. 17 is a schematic view of the configuration of the measurement device 100 according to a seventh embodiment. A description will be given of a method of increasing measurement accuracy by extracting light from the semiconductor substrate 101 to a transparent substrate 603 and returning the light to the semiconductor substrate 101. As described above in the fourth embodiment, as a result of increasing the distance over which light propagates after the occurrence of surface plasmon resonance, a change in resonance angle can be expanded as a change in coordinates on the photodiode array 103. Accordingly, the measurement accuracy increases. In this embodiment, for the descriptive purpose, the same numeral "603" as that of the dielectric layer is assigned to the transparent substrate 603.

In the seventh embodiment, light is incident on the transparent substrate 603 having a larger volume than the semiconductor substrate 101. Surface plasmon resonance is caused to occur in the sensitive portion disposed on the transparent substrate 603, and light is returned to the semiconductor substrate 101. Hereinafter, the present embodiment will be described in detail, but the description does not limit the scope of the present disclosure.

FIG. 17 is simplified for the description of the present embodiment. The scale, the number of constituent elements, and so forth illustrated in the figure are different from those of the actual configuration for convenience. The other structure and processing not described in the present embodiment are the same as those of any one of the first to sixth embodiments.

Eighth Embodiment

Figure 18:
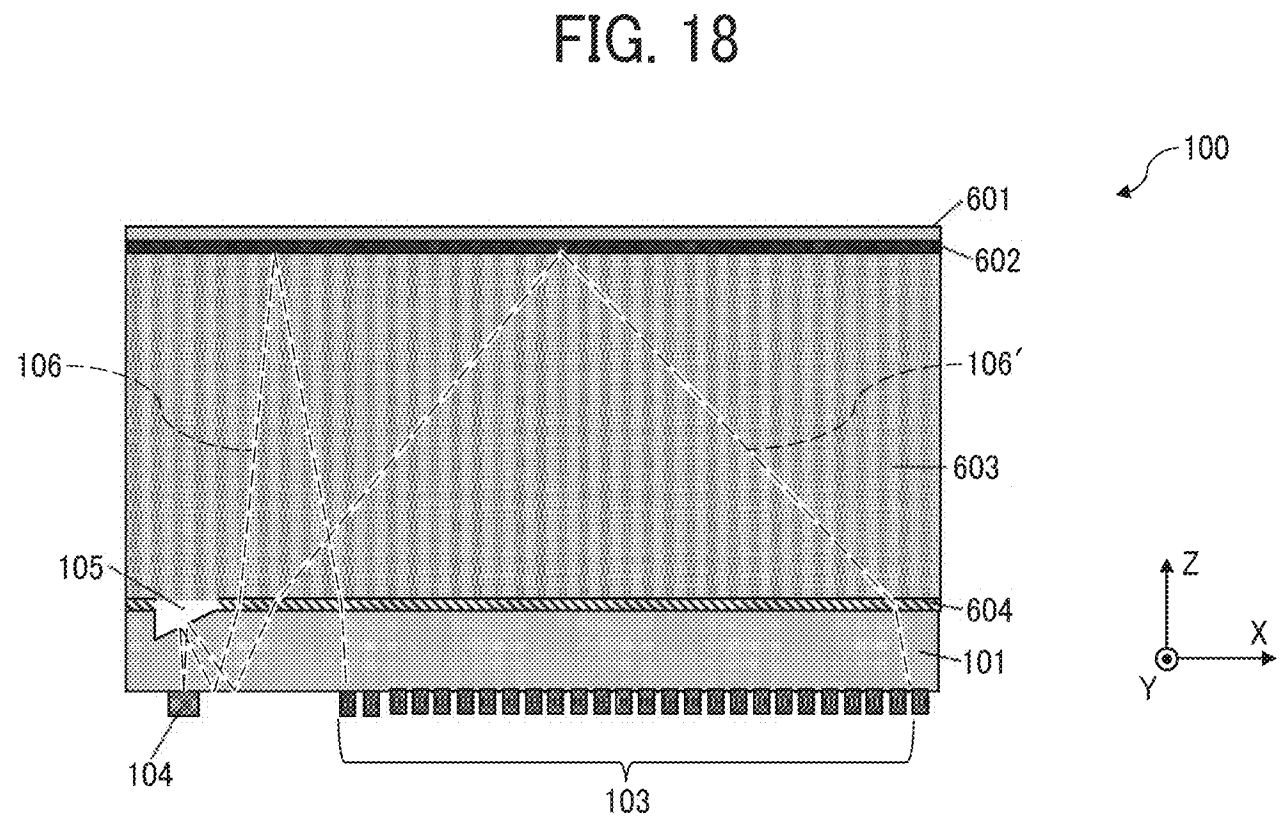

FIG. 18 is a schematic view of the configuration of the measurement device 100 according to an eighth embodiment. FIG. 18 is simplified for the description of the present embodiment. The scale, the number of constituent elements, and so forth illustrated in the figure are different from those of the actual configuration for convenience. The other structure and processing not described in the present embodiment are the same as those of any one of the first to seventh embodiments.

The light source 104 and the photodiode array 103 are formed on the semiconductor substrate 101 by crystal growth and a semiconductor process. On the front surface (the surface opposite to the crystal growth surface) of the semiconductor substrate 101, the antireflection coating 604 is disposed.

On the antireflection coating 604, the transparent substrate 603, which is a glass substrate, is in contact. The transparent substrate 603 is fixed by, for example, lamination or adhesion. The transparent substrate 603 may be made of a resin or another material as long as the transparent substrate 603 has a light-transmitting property. The transparent substrate 603 may be formed as a part of a microchannel.

The transparent substrate 603 is provided with the inclined mirror structure 105. The inclined mirror structure 105 is formed by polishing, gray scale exposure, etching, and the like. The inclined mirror structure 105 has such an angle that surface plasmon resonance occurs in the sensitive portion. A metal or dielectric multilayer film structure for increasing the reflectance may be disposed on the surface of the inclined mirror structure 105. On the transparent substrate 603, the metal layer 602 is disposed. Surface plasmon resonance occurs in the metal layer 602. On the metal layer 602, the sensitive film 601 is disposed.

In a modification, the inclined mirror structure 105 may be disposed on the semiconductor substrate 101. The inclined mirror structure 105 is formed by a method similar to the method according to any one of the first to sixth embodiments. The transparent substrate 603 on which the metal layer 602 and the sensitive film 601 are disposed may be bonded to the semiconductor substrate (in a wafer state) 101 on which the light source 104, the photodiode array 103, the inclined mirror structure 105, and the antireflection coating 604 are disposed, so as to obtain a wafer. In this case, the transparent substrate 603 can be bonded without highly accurate alignment. The transparent substrate 603 may have a microchannel.

In the measurement device 100 according to the seventh and eighth embodiments, the transparent substrate 603 is bonded to the semiconductor substrate 101, and the metal layer 602 is disposed on the surface of the transparent substrate 603.

In the present embodiment, as in the fourth embodiment, the propagation distance is increased to improve the performance of the surface plasmon resonance sensor. Because the transparent medium can be used as a channel, the cost may be reduced as compared with the first to third embodiments.

In the seventh and eighth embodiments, the photodiode array 103 is close to the reflective surface disposed on the semiconductor substrate 101. Thus, reflected light in an unintended direction may increase due to the flatness of a mirror surface or the like depending on a processing method and stray light is generated, so that the performance of surface plasmon resonance may decrease. An optimal method may be selected from among the method of the present embodiment and the methods of the first to sixth embodiments in consideration of the limitation of the cost and performance.

Ninth Embodiment

Figure 19:
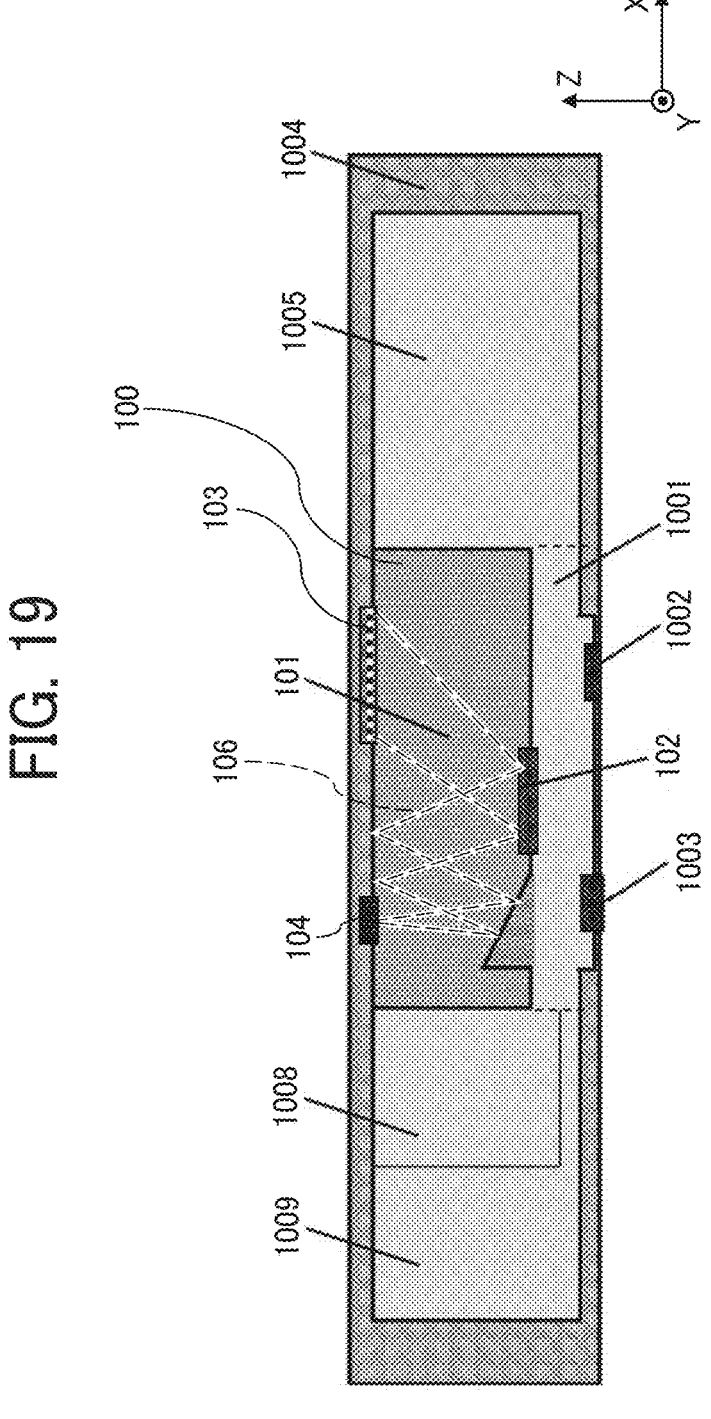
FIG. 19 is a schematic view (cross-sectional view) of a measurement device according to a ninth embodiment.

FIG. 19 is a schematic view of the measurement device 100 that is systematized according to a ninth embodiment. This configuration is obtained by connecting the measurement device (surface plasmon resonance sensor) 100 according to any one of the first to eighth embodiments to a microchannel with a reverse iontophoresis mechanism to systematize the measurement device 100. FIG. 19 is simplified for the description of the present embodiment. The scale, the arrangement of constituent elements, the number of constituent elements, and so forth illustrated in the figure are different from those of the actual configuration for convenience.

The measurement device (surface plasmon resonance sensor) 100 according to any one of the first to eighth embodiments is used by being fixed to a microchannel. The microchannel is formed in a glass, resin, or Si substrate by photolithography, etching, and the like. The channel width is about several tens of μm to several hundreds of μm. The microchannel is used to supply a liquid sample to the sensitive portion of the surface plasmon resonance sensor. The microchannel has a micropump, a microvalve, or the like formed using the micro electro mechanical systems (MEMS) technology or the like, so that the movement of the liquid to be used can be controlled. A micropump, a microvalve, or the like is not used when a capillary phenomenon in the microchannel is used.

When sweat is a target to be measured, for example, a reverse iontophoresis technique is applied for active sampling. The reverse iontophoresis technique is a technique of bringing an electrode into contact with skin and applying a current to cause a sweat component to exude onto the skin. An electrode is provided in a part of the microchannel, and a current is applied to perform active sweat sampling. When active sampling is not performed, the reverse iontophoresis technique is not applied. In this case, any sampling method may be used as long as a sample can be brought into contact with the sensitive portion.

The channel is connected to a region that stores an appropriate chemical solution to assist the supply of a liquid sample and to protect the sensitive portion. The chemical solution is, for example, a phosphate buffer solution. Alternatively, pure water or an appropriate chemical solution may be selected. The chemical solution is periodically added. The channel is not necessarily connected to the region that constantly stores the chemical solution. The region may be provided outside and the connection thereto may be established each time.

The channel is connected to a region that stores a regenerant for removing organic molecules captured on the surface of the sensitive portion and regenerating the function of the sensor. The regenerant is periodically added. The channel is not necessarily connected to the region that constantly stores the regenerant. The region may be provided outside and the connection thereto may be established each time.

The channel is connected to a region that stores a measured sample. The measured sample is temporarily held and periodically discarded. The channel is not necessarily connected to the region that constantly stores the sample. The sample may be released to the outside each time. The sample may be saliva, plasma, urine, tears, or the like instead of sweat.

The configuration of the present embodiment illustrated in FIG. 19 will be described. The sensitive portion 102 of the measurement device (surface plasmon resonance sensor) 100 is connected to a microchannel 1001. The organic molecules passing through the microchannel 1001 are captured by the sensitive portion 102 to cause a change in resonance angle.

The microchannel 1001 is provided with a first electrode 1002 and a second electrode 1003. For example, when the first electrode 1002 and the second electrode 1003 are brought into contact with skin and a current is applied, sweat can be exuded from the skin by the reverse iontophoresis technique. The exuded sweat is guided to the sensitive portion 102 and is sensed. The electrodes for reverse iontophoresis may be in the form of rectangular or circular pads. An electrode of one polarity may be disposed so as to surround an electrode of the other polarity. The electrodes may be arranged so as to enable efficient sampling.

When saliva, plasma, or the like is collected separately, the microchannel 1001 may be used without applying the reverse iontophoresis technique. The microchannel 1001 has a micropump or microvalve mechanism, so that adequate fluid control in the microchannel 1001 can be performed.

The microchannel 1001 is connected to a region 1008 that stores a chemical solution for assisting supply of liquid and protecting the sensitive film. The organic molecules to be measured which have exuded into the microchannel 1001 near the second electrode 1003 are supplied to the sensitive portion 102 using, for example, a phosphate buffer solution. The chemical solution to be used may be other than the phosphate buffer solution. An appropriate chemical solution may be used depending on the material of the sensitive film.

Depending on a sensitive film, the performance of the surface plasmon resonance sensor may be deteriorated or the function of the surface plasmon resonance sensor may be lost due to adhesion of impurities to the surface of the sensitive film at the time of exposure to the atmosphere or drying. Thus, to protect the surface of the sensitive film, the surface of the sensitive film is constantly immersed in a chemical solution, or a chemical solution is caused to constantly flow over the surface of the sensitive film. Alternatively, a drying process may be performed such that adhesion of impurities or the like does not occur. Alternatively, the region 1008 that stores the chemical solution may be eliminated, and the chemical solution may be directly supplied from the outside at an appropriate timing.

The microchannel 1001 is connected to a region 1009 that stores a regenerant for removing organic molecules captured by the sensitive film 601. When organic molecules are captured by the sensitive film 601, the organic molecules are kept captured in a normal case, which adversely affects the next measurement. Thus, it is preferable to remove the organic molecules by using a regenerant for each measurement. For example, when antibodies that capture cortisol are used as the sensitive film 601, 10 mM HCL-glycine buffer solution at pH 2.5 or the like is used. Alternatively, another appropriate chemical solution may be selected. Alternatively, the region 1009 that stores the regenerant may be eliminated, and the regenerant may be directly supplied from the outside at an appropriate timing.

The microchannel 1001 is connected to a region 1005 that temporarily stores a measured sample, a buffer solution, and the like as waste liquid. All the waste liquid is collected here and discarded at an appropriate timing. Alternatively, the region 1005 that stores the waste liquid may be eliminated, and the waste liquid may be discharged to the outside.

The surface plasmon resonance sensor serving as the measurement device 100, the microchannel 1001, the regions 1005, 1008, and 1009 that store chemical solutions and waste liquid, and the first and second electrodes 1002 and 1003 for reverse iontophoresis are integrally mounted in one package or the like and can be incorporated into various systems. Alternatively, the individual elements may be separately mounted as appropriate.

In the measurement device 100 according to the present embodiment, at least a part of the transparent substrate 603 serves as a channel for supplying a subject liquid to the metal layer 602.

In the measurement device 100 according to the present embodiment, the first and second electrodes 1002 and 1003 are disposed on the surface of the transparent substrate 603.

According to the ninth embodiment, use of a microchannel provided with electrodes for reverse iontophoresis makes it possible to prevent an increase in system size and to perform real-time measurement by active sampling.

Tenth Embodiment

Figures 20A, 20B, 20C:
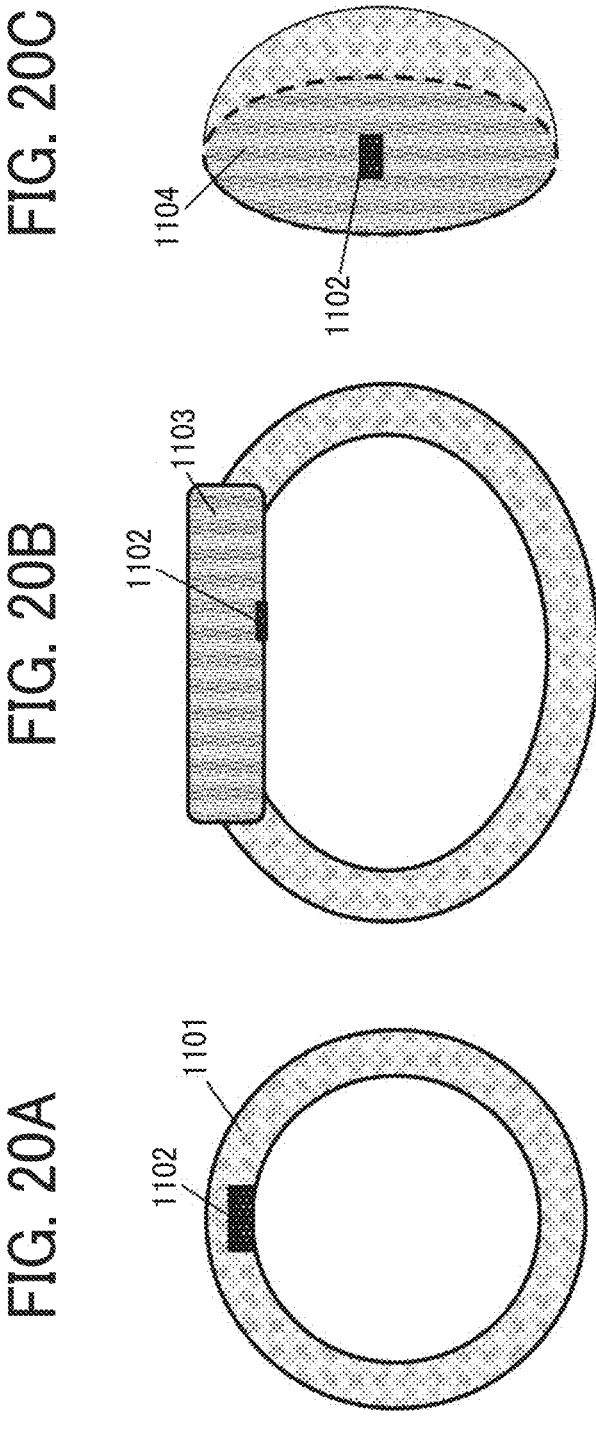
FIG. 20A, FIG. 20B, and FIG. 20C are views each illustrating a wearable device according to a tenth embodiment.

Schematic views of wearable devices according to a tenth embodiment are illustrated in FIGS. 20A, 20B, and 20C. The present embodiment provides an example of various wearable devices that employ the measurement device (surface plasmon resonance sensor) 100 according to any one of the first to eighth embodiments or the system thereof, that is, a surface plasmon resonance sensor system 1102, and that can perform real-time monitoring of biomolecules.

The measurement device 100 has a chip shape and has a size equal to or smaller than 1 mm, which is smaller than an existing measurement device. The measurement device 100 can be manufactured to have a system size of about several millimeters even when a channel or the like is included. Thus, the measurement device 100 is applicable to various wearable devices.

The wearable device that is in contact with skin can constantly monitor, for example, cortisol in real time by using sweat as a measurement target. The wearable device can monitor glucose or other various bioorganic molecules in real time instead of cortisol. The wearable device can be used for quantitative monitoring of stress by real-time quantification of cortisol, which is a stress hormone; non-invasive real-time monitoring of a blood glucose level; and real-time monitoring of other biomolecules in life activities or social activities of humans or animals, which have been previously difficult.

Hereinafter, the tenth embodiment will be described in detail using examples, but the embodiment does not limit the scope of the present disclosure.

FIGS. 20A, 20B, and 20C are views illustrating a ring-type device, a watch-type device, and a contact-lens-type device employing the measurement device 100 according to the present embodiment. FIGS. 20A, 20B, and 20C are simplified for the description of the present embodiment, and the configurations illustrated therein are different from actual configurations for convenience. FIG. 20A is a schematic cross-sectional view of a ring-type device, FIG. 20B is a schematic cross-sectional view of a watch-type device, and FIG. 20C is a schematic overhead view of a contact-lens-type device.

The surface plasmon resonance sensor system 1102 is mounted inside a ring-type device 1101 in FIG. 20A. An electrode for reverse iontophoresis is disposed at a portion that is to be in contact with skin. Active sweat sampling is performed, and the concentration of biomolecules such as cortisol contained in sweat can be constantly monitored. Other components such as a control integrated circuit (IC) and a battery are also incorporated in the ring-type device 1101.

Similarly, the surface plasmon resonance sensor system 1102 is disposed in a region that is to be in contact with skin of a watch-type device 1103 in FIG. 20B. The surface plasmon resonance sensor system 1102 may be disposed in a band portion instead of a position on the back of the clockface. Similarly, the surface plasmon resonance sensor system 1102 is disposed in a contact-lens-type device 1104 in FIG. 20C. In this case, tears rather than sweat are used as a sample. An electrode for reverse iontophoresis may be omitted. The surface plasmon resonance sensor system 1102 is also applicable to devices that are to be in contact with skin for a long time, such as glasses, virtual reality (VR) goggles, necklaces, earrings, pierced earrings, and shoes.

The wearable devices (1101, 1103, 1104) according to the present embodiment each include the measurement device 100 (the surface plasmon resonance sensor system 1102). This implements a wearable sensor that can perform highly accurate detection while maintaining comfort as a compact measurement device.

According to the tenth embodiment, the health state and stress state of a living body are correlated with a change in concentration of various biomolecules existing in the living body. The change varies, for example, in the case of cortisol called a stress hormone, over a period of several minutes to several tens of minutes. In an existing hormone analysis method (enzyme-linked immunosorbent assay (ELISA) or the like), frequent measurement at intervals of several minutes is not practical.

As illustrated in the present embodiment, when a compact surface plasmon resonance sensor is applied to a device that is to be in contact with skin for a long time, such as a wearable device, and active sampling is performed by a reverse iontophoresis technique or the like, constant monitoring of the concentration of biomolecules, which has been previously impossible, becomes possible.

Eleventh Embodiment

Figure 21:
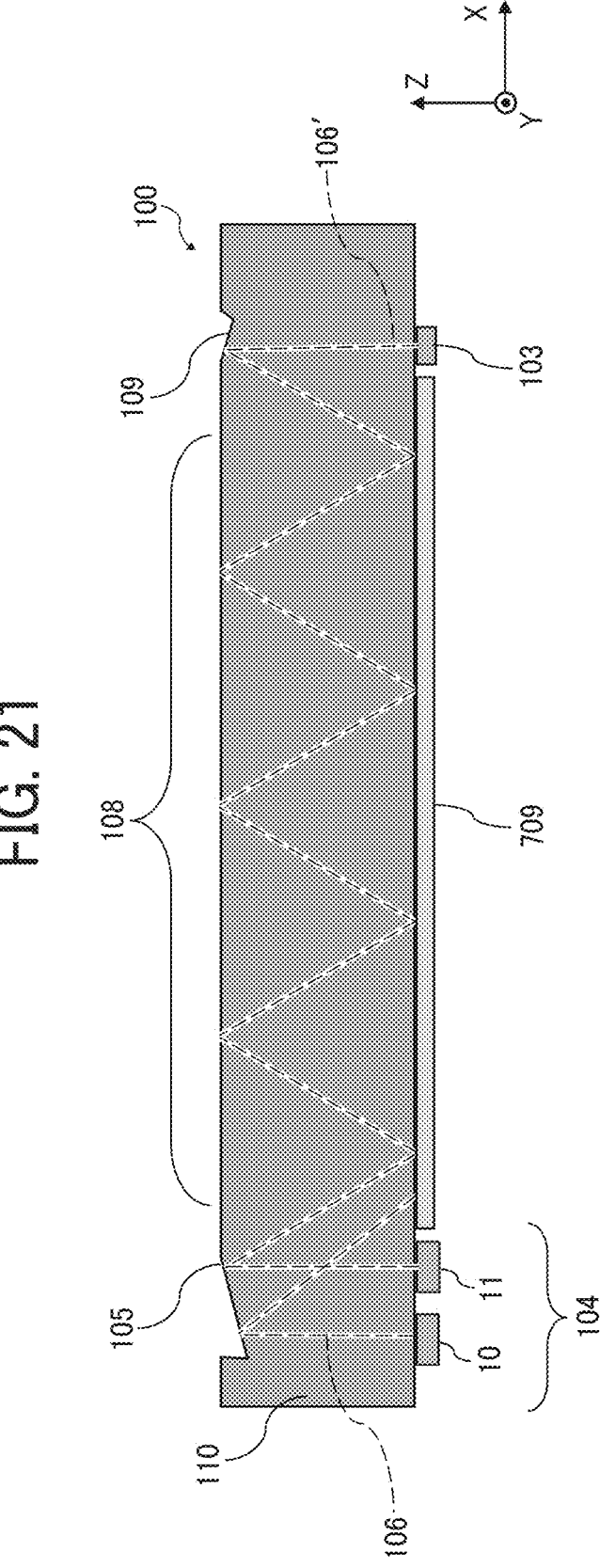
FIG. 21 is a schematic view of a measurement device according to an eleventh embodiment.

A schematic view of the measurement device 100 according to an eleventh embodiment is illustrated in FIG. 21 The measurement device 100 according to the present embodiment includes a measurement portion 108 employing the attenuated total reflection (ATR) method. The measurement device 100 includes the light source 104 and the photodiode array 103 formed on a semiconductor substrate 110 by film formation, and the light 106 and 106' propagates through the semiconductor substrate 110. Thus, the measurement device 100 is a very small device based on the ATR method. Thus, the measurement device 100 is an example of a wearable device that can perform real-time monitoring of biomolecules.

Molecular analysis using infrared light is a technique of analyzing a molecular structure using the property of a molecule of absorbing light having a specific wavelength due to molecular vibration. Absorption typically occurs with light in the mid-infrared region, and thus a light source that emits wide-range mid-infrared light is used. A sample is irradiated with light from the light source, and transmitted light is detected after being dispersed by a spectroscope or the like to obtain a transmission spectrum (or an absorption spectrum). From the obtained spectral shape, molecules are identified and the concentration thereof is analyzed. There is an analysis method in which an interference system is constructed, a sample is irradiated with infrared light that interferes, and transmitted interference light is subjected to Fourier transform to obtain an absorption spectrum. This is a spectroscopic analysis technique for a molecule structure called Fourier transform infrared spectroscopy (FT-IR).

There is a spectroscopic analysis technique using near-infrared light instead of mid-infrared light. The spectroscopic analysis technique using near-infrared light can be used in an optical system similar to that of the above-described infrared spectroscopic technique. In particular, analysis similar to FT-IR using near-infrared light is called Fourier transform near-infrared spectroscopy (FT-NIR).

The ATR method is a spectroscopic analysis method using an evanescent wave generated when a sample is brought into close contact with a prism and light is totally reflected by a prism surface. The ATR method can be handled in combination with an analysis technique such as FT-IR described above. When light is incident on the interface between the prism and the sample at an angle equal to or larger than the critical angle, total reflection occurs. At this time, the incident light penetrates into the sample once by about several hundred nm (evanescent wave) and is then reflected. Absorption depending on the molecular structure of the sample occurs in the evanescent wave that has penetrated into the sample, and reflected light is detected to perform molecular analysis. The prism is typically made of glass, germanium, ZnSe, or the like, but may be made of another material.

In the case of using a single-wavelength light source such as a laser instead of a wide-range mid-infrared light source, the light source that is used emits light with a wavelength at which a characteristic absorption peak of an absorption spectrum of a molecule can be obtained. The correlation between major molecules and characteristic wavelengths for absorption is illustrated in Table 1. There are characteristic wavelengths other than the wavelengths described below, and any wavelength may be used.

TABLE 1

| Molecule | Wavelength |
| --- | --- |
| Carbon monoxide | 4.6 μm |
| Carbon dioxide | 4.2 μm |
| Nitrogen monoxide | 5.3 μm |
| Isoprene | 3.4 μm |
| Ammonia | 1.5 μm |
| Ethanol | 1.7 μm |
| Glucose | 10 μm |
| Water | 1.45 μm |

According to Larin, et al., "Noninvasive Blood Glucose Monitoring With Optical Coherence Tomography", Diabetes Care, 25(12): 2263-2267, on the assumption that a blood glucose level can be estimated by determining a signal change at a certain depth of a tomographic image in optical coherence tomography (OCT), a blood glucose level was estimated from a signal obtained by pinpoint measurement of skin tissue (dermal tissue) 200 to 600 μm below a skin surface by an OCT device using near-infrared light of 1300 nm. In the example disclosed in Larin, a change in a measured OCT signal was measured as a change in scattering coefficient caused by a change in glucose concentration in skin tissue, and there was a change of 2.8% at the maximum with respect to a change in glucose concentration of 10 mg/dL.

In the first to tenth embodiments, for example, a back-emission light-emitting diode or a back-emission surface emitting laser is used as a light source. The emission wavelength range of the light source is typically the range of visible light to near-infrared rays of 2000 nm depending on the characteristics of a material. Thus, the light source can be used in near-infrared spectroscopy. On the other hand, the wavelengths suitable for molecular analysis by infrared spectroscopy such as FT-IR are typically mid-infrared rays of 2000 nm to 20000 nm. Thus, a light source that can emit mid-infrared rays is to be formed.

An example of a light source that can emit light in a substrate direction and can emit mid-infrared rays is a quantum-cascade vertical-cavity surface-emitting laser (QC-VCSEL). Also in this configuration, a QC-VCSEL structure can be crystal-grown on a semiconductor substrate by using an MOCVD device, an MBE device, or the like. The structure can be formed by an appropriate semiconductor process and used as a light source that emits mid-infrared rays in the substrate direction.

In the case of infrared spectroscopy using near-infrared light, a photodiode array can be used as a light-receiving element as in the first to tenth embodiments. On the other hand, for example, it is difficult for a normal photodiode structure to detect mid-infrared rays using a QC-VCSEL. Thus, for example, at the time of forming a light-receiving element by using selective etching and a recrystallization growth technique as in the third embodiment, the material of a carrier generation layer having sensitivity to mid-infrared rays and the film thickness of each layer are to be designed. An example of the material of the carrier generation layer having sensitivity to mid-infrared rays is InAsSb or the like. When a superlattice structure of InAs and GaSb is grown such that individual layers have an appropriate film thickness, minibands having a narrow energy interval are formed, mid-infrared rays are absorbed, and carrier transition occurs between the minibands. The structure can function as a light-receiving element for mid-infrared rays by using the light absorption.

These materials can be formed by a crystal growth technique such as MOCVD or MBE. The carrier generation layer may be made of a material system other than InAsSb, InAs, or GaSb. Alternatively, a mid-infrared detector such as a bolometer, a mercury cadmium telluride (MCT) sensor, a pyroelectric sensor, or a quantum dot sensor may be used as appropriate.

An optical system for molecular analysis based on infrared spectroscopy using the existing ATR method includes a spectroscope, an interference system, and other optical elements such as a mirror and a lens, resulting in an increased size of the device. In contrast, by using a substrate as a substitute for a prism of the ATR method without vapor-depositing a metal on the sensitive portion of the first to tenth embodiments, a device smaller than an infrared spectroscopic analyzer using the existing ATR method can be obtained.

The light source 104 illustrated in FIG. 21 includes a surface emitting laser 10 having a wavelength in a 1300 nm band and being formed on an InP substrate by a crystal growth technique such as MOCVD or MBE. In the present embodiment, the light source 104 also includes a surface emitting laser 11 having a wavelength in a 1400 nm band and being adjacent to the surface emitting laser 10. The surface emitting laser 11 is used as reference light at the time of relatively quantifying a blood glucose level from a light absorption amount. The two wavelengths make it is possible to correct variations in external factors as environmental changes, such as the amount of moisture and the degree of contact of a measurement portion with skin. The correction enables continuous and stable measurement, and a relative chronological change in blood glucose level or the like can be visualized in the form of a graph. As a manufacturing method of forming the surface emitting lasers of the two wavelengths on the same substrate, the method described in the third embodiment may be used, or another appropriate method may be used.

The semiconductor substrate 110 is an InP substrate and is transparent at the wavelengths 1300 nm and 1400 nm employed in the present embodiment. Thus, the light 106 is incident on the measurement portion 108 without being attenuated. At this time, the inclined mirror structure 105 is disposed in the propagation path, and the light 106 that propagates is incident on the measurement portion 108 at an incident angle designed for the measurement portion 108. Accordingly, an ATR method using a total reflection angle can be implemented. The second mirror structure 709 is disposed on the surface of the semiconductor substrate 110 as viewed in the −Z direction so that the light propagating through the semiconductor substrate 110 causes multiple reflection. Because the light 106 is incident on the measurement portion 108 many times due to multiple reflection, high sensitivity is achieved. The light 106' reflected by the measurement portion 108 is received by the photodiode array 103 via an inclined mirror 109 and is detected. In the present embodiment, the light that is reflected the last time among a plurality of times of reflection by the measurement portion 108 and that travels toward the photodiode array 103 is referred to as reflected light 106'.

The measurement device 100 according to the present embodiment uses the 1300 nm band, which is considered to have correlation with a blood glucose level, and thus can read a chronological change in blood glucose level by continuously measuring the blood glucose level. In the present embodiment, the measurement device 100 is as small as several millimeters, and thus can be fixed in an oral cavity via a mucosal patch. Because an oral mucosa is thin and contains a large amount of interstitial fluid, a blood glucose level can be measured with high accuracy using the ATR method (Japanese Unexamined Patent Application Publication No. 2021-067652).

Even a small measurement device according to the present embodiment can be driven by a battery for several days and is suitable as a wearable sensor that detects a chronological change.

As described above, an example of the aspects of the present disclosure is as follows.

According to a first aspect, a measurement device 100 includes a semiconductor substrate 101; a light-emitting element 104 that is disposed on the semiconductor substrate 101 and that emits light 106 into the semiconductor substrate 101; a measurement portion 102 on which the light 106 that has passed through the semiconductor substrate 101 is incident as incident light and that reflects at least a part of the incident light as reflected light 106'; and a light-receiving element 103 that receives the reflected light 106' that has passed through the semiconductor substrate 101. Accordingly, a holding portion of the light-emitting element 104 also serves as a light propagation path, and thus the measurement device 100 has a reduced size.

According to a second aspect, a measurement device 100 includes a semiconductor substrate 101; a light-emitting element 104 that emits light 106 into the semiconductor substrate 101; a measurement portion 102 on which the light 106 that has passed through the semiconductor substrate 101 is incident as incident light and that reflects at least a part of the incident light as reflected light 106'; and a light-receiving element 103 that is disposed on the semiconductor substrate 101 and that receives the reflected light 106' that has passed through the semiconductor substrate 101. Accordingly, a holding portion of the light-receiving element 103 also serves as a light propagation path, and thus the measurement device 100 has a reduced size.

According to a third aspect, in the measurement device 100 of the first aspect, the light-receiving element 103 is disposed on the semiconductor substrate 101. Accordingly, a holding portion of the light-receiving element 103 also serves as a holding portion of the light-emitting element 104, and thus the measurement device 100 has a reduced size.

According to a fourth aspect, in the measurement device 100 of any one of the first to third aspects, the semiconductor substrate 101, the light-emitting element 104, the light-receiving element 103, and the measurement portion 102 are integrated together. Accordingly, the light-emitting element 104 and the light-receiving element 103 can be disposed close to each other, and main components of the measurement device 100 can be arranged with high density. Because the light-emitting element 104, the light-receiving element 103, and the measurement portion 102 are aligned with high accuracy, the measurement accuracy increases.

According to a fifth aspect, in the measurement device 100 of any one of the first to fourth aspects, the light-emitting element 104 and the light-receiving element 103 are disposed on the same surface of the semiconductor substrate 101 by film formation. As a result of a semiconductor process such as photolithography performed on the same plane, the relative positional accuracy of the light-emitting element 104 and the light-receiving element 103 increases and the measurement accuracy increases.

According to a sixth aspect, in the measurement device 100 of any one of the first to fifth aspects, the light-emitting element 104 includes a surface emitting laser. Accordingly, direct incidence of light on the semiconductor substrate 101 can be performed, and thus the measurement device 100 having a reduced size can be provided.

According to a seventh aspect, in the measurement device 100 of any one of the first to sixth aspects, the light-emitting element 104 includes a first upper contact layer 302, a first carrier excitation layer 306, and a first lower contact layer 308 closer to the semiconductor substrate 101 than the first upper contact layer 302. The light-receiving element 103 includes a second upper contact layer 402, a second carrier excitation layer 406, and a second lower contact layer 408 closer to the semiconductor substrate 101 than the second upper contact layer 402. At least the first lower contact layer 308 and the second lower contact layer 408 include the same material. Accordingly, simultaneous crystal growth makes it possible to employ a low-cost manufacturing method and provide a low-cost compact measurement device.

According to an eighth aspect, in the measurement device 100 of any one of the first to seventh aspects, the light-emitting element 104 and the light-receiving element 103 each include a corresponding one of carrier excitation layers 306 and 450. The carrier excitation layers 306 and 450 have different film thicknesses or include different materials. Accordingly, lower contact layers can be simultaneously formed by crystal growth. Thus, an increased light-reception sensitivity can be achieved by using film thicknesses and materials optimal to receive light for the light-receiving element 103 separately crystal-grown, while a method of realizing a low cost is used as a manufacturing method. Highly accurate measurement can be performed by the highly sensitive light-receiving element 103.

According to a ninth aspect, in the measurement device 100 of any one of the first to eighth aspects, the light is reflected at least twice or more within the semiconductor substrate 101. Accordingly, a light propagation distance can be increased and detection accuracy can be increased while a small size is maintained.

According to a tenth aspect, a wearable device (1101, 1103, 1104) includes the measurement device 100 (1102) of any one of the first to ninth aspects. This implements a wearable sensor that can perform highly accurate detection while maintaining comfort as a compact measurement device.

According to an eleventh aspect, a method of manufacturing a measurement device 100 includes forming a light-emitting element 104 on a semiconductor substrate 101 such that light 106 is emitted by the light-emitting element 104 into the semiconductor substrate 101; and disposing a measurement portion 102 on the semiconductor substrate 101 such that the light 106 that has passed through the semiconductor substrate 101 is incident on the measurement portion 102. Accordingly, a compact measurement device can be provided.

According to a twelfth aspect, a method of manufacturing a measurement device 100 includes disposing a measurement portion 102 on a semiconductor substrate 101 such that light 106 that has passed through the semiconductor substrate 101 is incident on the measurement portion 102; and forming a light-receiving element 103 on the semiconductor substrate 101 such that reflected light 106' is received by the light-receiving element 103, the reflected light 106' being generated as a result of the light 106 incident on the measurement portion 102 being reflected by the measurement portion 102. Accordingly, a compact measurement device can be provided.

According to a thirteenth aspect, the measurement device 100 is a surface plasmon resonance sensor having a characteristic of any one of the first to twelfth aspects and including the measurement portion 102 including a metal layer 602 that causes surface plasmon resonance. Accordingly, measurement with very high sensitivity can be performed using a surface plasmon resonance phenomenon.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention. Any one of the above-described operations may be performed in various other ways, for example, in an order different from the one described above.

The invention claimed is:

1. A measurement device comprising:
   a semiconductor substrate;
   a light-emitting element that is disposed on the semiconductor substrate and that emits light into the semiconductor substrate, the light-emitting element including a plurality of layers;
   a measurement portion on which the light that has passed through the semiconductor substrate is incident as incident light and that reflects at least a part of the incident light as reflected light; and
   a light-receiving element that is disposed on a surface of the semiconductor substrate where the light-emitting element is disposed and that receives the reflected light that has passed through the semiconductor substrate, the light-receiving element including a plurality of layers,
   wherein at least some of the plurality of layers of the light-emitting element and some of the plurality of layers of the light-receiving element are made of a same material.

2. The measurement device according to claim 1, wherein;
   the semiconductor substrate, the light-emitting element, the light-receiving element, and the measurement portion are integrated into a single unit.

3. The measurement device according to claim 2, wherein:
   the light-emitting element and the light-receiving element are disposed on a same surface of the semiconductor substrate by film formation.

4. The measurement device according to claim 3, wherein;
   the light-emitting element and the light-receiving element each include a corresponding one of carrier excitation layers, the carrier excitation layers having different film thicknesses or including different materials.

5. The measurement device according to claim 1, wherein:
   the light-emitting element includes a surface emitting laser.

6. The measurement device according to claim 5, wherein;
   the plurality of layers of the light-emitting element includes:
      a first upper contact layer;
      a first carrier excitation layer; and
      a first lower contact layer closer to the semiconductor substrate than the first upper contact layer,
   the plurality of layers of the light-receiving element includes:
      a second upper contact layer;
      a second carrier excitation layer; and a second lower contact layer closer to the semiconductor substrate than the second upper contact layer, and
   at least the first lower contact layer and the second lower contact layer include a same material.

7. The measurement device according to claim 5, wherein:
   the surface emitting laser is a back-emission surface emitting layer that emits the light toward the semiconductor substrate.

8. The measurement device according to claim 1, wherein:
   the light is reflected at least twice or more within the semiconductor substrate.

9. The measurement device according to claim 1, wherein;
   the measurement portion includes a metal layer that causes surface plasmon resonance.

10. A wearable device comprising:
    the measurement device according to claim 1; and
    an area that is to be in contact with a measurement target.

11. A measurement device comprising:
    a semiconductor substrate;
    a light-emitting element that is disposed on the semiconductor substrate and that emits light into the semiconductor substrate;
    a measurement portion on which the light that has passed through the semiconductor substrate is incident as incident light and that reflects at least a part of the incident light as reflected light; and
    a light-receiving element that is disposed on a surface of the semiconductor substrate where the light-emitting element is disposed and that receives the reflected light that has passed through the semiconductor substrate,
    wherein the light-emitting element and the light-receiving element each include a corresponding one of carrier excitation layers, the carrier excitation layers having different film thicknesses or including different materials.

12. The measurement device according to claim 11, wherein;
    the measurement portion includes a metal layer that causes surface plasmon resonance.

13. A wearable device comprising:
    the measurement device according to claim 11; and
    an area that is to be in contact with a measurement target.

14. The measurement device according to claim 11, wherein:
    the semiconductor substrate, the light-emitting element, the light-receiving element, and the measurement portion are integrated into a single unit.

15. The measurement device according to claim 14, wherein:
    the light-emitting element and the light-receiving element are disposed on a same surface of the semiconductor substrate by film formation.

16. The measurement device according to claim 11, wherein:
    the light-emitting element includes a surface emitting laser.

17. The measurement device according to claim 16, wherein:
    the plurality of layers of the light-emitting element includes:
       a first upper contact layer;
       a first carrier excitation layer; and
       a first lower contact layer closer to the semiconductor substrate than the first upper contact layer, the plurality of layers of the light-receiving element includes:

a second upper contact layer;

a second carrier excitation layer; and a second lower contact layer closer to the semiconductor substrate than the second upper contact layer, and at least the first lower contact layer and the second lower contact layer include a same material.

18. The measurement device according to claim 16, wherein:

the surface emitting laser is a back-emission surface emitting layer that emits the light toward the semiconductor substrate.

19. The measurement device according to claim 11, wherein:

the light is reflected at least twice or more within the semiconductor substrate.

20. A method of manufacturing a measurement device, the method comprising:

forming a light-emitting element such that light is emitted by the light-emitting element into a semiconductor substrate of the measurement device;

forming a light-receiving element such that reflected light is received by the light-receiving element; and disposing a measurement portion on the semiconductor substrate such that the light that has passed through the semiconductor substrate is incident on the measurement portion, wherein:

the reflected light being generated as a result of the light incident on the measurement portion being reflected by the measurement portion, the forming of the light-emitting element includes forming the light-emitting element on the semiconductor substrate, and the forming of the light-receiving element forms the light-receiving element on the semiconductor substrate.

* * * * *